US012684712B2

(12) United States Patent
He

(10) Patent No.: US 12,684,712 B2
(45) Date of Patent: Jul. 14, 2026

(54) DISPLAY DEVICE AND METHOD FOR CONTROLLING DISPLAY DEVICE

(71) Applicant: Shanghai Tianma Micro-electronics Co., Ltd., Shanghai (CN)

(72) Inventor: Yongxin He, Shanghai (CN)

(73) Assignee: Shanghai Tianma Micro-electronics Co., Ltd., Shanghai (CN)

( * ) Notice: Subject to any disclaimer, the term of this patent is extended or adjusted under 35 U.S.C. 154(b) by 484 days.

(21) Appl. No.: 18/204,623

(22) Filed: Jun. 1, 2023

(65) Prior Publication Data

US 2024/0324120 A1 Sep. 26, 2024

(30) Foreign Application Priority Data

Mar. 22, 2023 (CN) .......................... 202310289370.0

(51) Int. Cl.
| | |
|---|---|
| *H05K 5/02* | (2006.01) |
| *B60K 35/00* | (2006.01) |
| *G05B 15/02* | (2006.01) |
| *H10K 59/90* | (2023.01) |
| *B60K 35/22* | (2024.01) |

(Continued)

(52) U.S. Cl.
CPC ........... *H05K 5/0217* (2013.01); *B60K 35/00* (2013.01); *G05B 15/02* (2013.01); *H10K 59/90* (2023.02); *B60K 35/22* (2024.01); *B60K 35/223* (2024.01); *B60K 35/53* (2024.01); *B60K 2360/48* (2024.01);

(Continued)

(58) Field of Classification Search
CPC ........ H05K 5/0217; H05K 7/18; B60K 35/00; B60K 35/22; B60K 35/223; B60K 35/53;

B60K 2360/48; G05B 15/02; H10K 59/90; H10K 2102/311; G06V 40/161; G10L 25/78; G09F 9/301; G09F 9/335; G09F 9/35; B60R 11/0229; B60R 2011/0085

See application file for complete search history.

(56) References Cited

U.S. PATENT DOCUMENTS

| | | | | |
|---|---|---|---|---|
| 9,648,374 | B2 * | 5/2017 | Rawlinson ....... | H04N 21/42201 |
| 9,888,587 | B2 * | 2/2018 | Zeng ................... | H05K 5/0217 |

(Continued)

FOREIGN PATENT DOCUMENTS

| | | |
|---|---|---|
| CN | 103915041 A | 7/2014 |
| CN | 110293912 A | 10/2019 |

(Continued)

*Primary Examiner* — Ibrahim A Khan
(74) *Attorney, Agent, or Firm* — Anova Law Group, PLLC

(57) ABSTRACT

A display device and a method for controlling a display device are provided. The display device includes a flexible display module and a bracket. The flexible display module includes a supporting backplate; the supporting backplate is located on a backlight side of the flexible display module; the flexible display module also includes a plurality of sensor devices; the bracket is fixed to the supporting backplate through a universal structure; one end of the universal structure is fixed to the supporting backplate; another end of the universal structure is fixed to the bracket; the plurality of sensor devices are electrically connected to the universal structure through a first motor component; and/or, the supporting backplate includes a hinge component and the plurality of sensor devices are electrically connected to the hinge component through a second motor component.

21 Claims, 28 Drawing Sheets

(51) Int. Cl.

| | |
|---|---|
| *B60K 35/53* | (2024.01) |
| *G06V 40/16* | (2022.01) |
| *G10L 25/78* | (2013.01) |
| *H10K 102/00* | (2023.01) |

(52) U.S. Cl.

CPC ............ *G06V 40/161* (2022.01); *G10L 25/78* (2013.01); *H10K 2102/311* (2023.02)

(56) References Cited

U.S. PATENT DOCUMENTS

| | | | | |
|---|---|---|---|---|
| 10,504,490 | B2 * | 12/2019 | Jeon ........................ | G09G 5/14 |
| 11,061,436 | B2 * | 7/2021 | O'Neil ................. | G06F 1/1616 |
| 11,503,729 | B2 * | 11/2022 | Zhang ................. | G06F 1/1681 |
| 11,614,198 | B2 * | 3/2023 | Alcorn .................. | G06V 40/18 |
| | | | | 351/215 |
| 11,977,420 | B2 * | 5/2024 | Ou ...................... | H04M 1/0268 |
| 11,995,229 | B2 * | 5/2024 | Zhang .................. | B60K 35/80 |
| 12,092,151 | B2 * | 9/2024 | Trzaskos ................ | F16C 11/04 |
| 2006/0050018 | A1 * | 3/2006 | Hutzel ..................... | B60R 1/12 |
| | | | | 345/60 |

| | | | | |
|---|---|---|---|---|
| 2006/0164230 | A1 * | 7/2006 | DeWind ................. | B60K 35/81 |
| | | | | 340/461 |
| 2008/0068520 | A1 * | 3/2008 | Minikey ........... | G02B 27/0101 |
| | | | | 349/114 |
| 2010/0295782 | A1 * | 11/2010 | Binder .................... | H04M 3/02 |
| | | | | 348/222.1 |
| 2015/0138043 | A1 * | 5/2015 | Rawlinson ........... | G06F 3/1454 |
| | | | | 345/2.2 |
| 2015/0146359 | A1 * | 5/2015 | Katsunuma ........... | F16M 11/18 |
| | | | | 361/679.22 |
| 2018/0137801 | A1 * | 5/2018 | An ........................ | G09G 3/2092 |
| 2018/0332389 | A1 * | 11/2018 | Ekkizogloy ............. | G10L 15/26 |
| 2020/0409422 | A1 * | 12/2020 | Wang ................... | F16C 11/045 |
| 2021/0291660 | A1 * | 9/2021 | Szczerba ............... | B60K 35/22 |
| 2022/0020304 | A1 * | 1/2022 | Couillard ................ | G09G 3/03 |
| 2022/0105876 | A1 * | 4/2022 | Kim ................... | B60R 11/0235 |
| 2022/0317767 | A1 * | 10/2022 | Zhang ................... | B60K 35/22 |

FOREIGN PATENT DOCUMENTS

| | | |
|---|---|---|
| CN | 112298059 A | 2/2021 |
| CN | 113196373 A | 7/2021 |
| CN | 114446171 A | 5/2022 |

* cited by examiner

102

```
┌─────────────────────────────────────────────────────────────┐
│  ┌──────────────┐  ┌──────────────────┐  ┌──────────────┐   │
│  │              │  │  Human face      │  │  Ambient     │   │
│  │  Voice       │  │  recognition     │  │  brightness  │   │
│  │  recognition │  │  sensor          │  │  recognition │   │
│  │  sensor 1021 │  │  1022/           │  │  sensor 1024 │   │
│  │              │  │  Human eye       │  │              │   │
│  │              │  │  recognition     │  │              │   │
│  │              │  │  sensor 1023     │  │              │   │
│  └──────────────┘  └──────────────────┘  └──────────────┘   │
└─────────────────────────────────────────────────────────────┘
```

```
┌──────────────────┐              ┌──────────────────┐
│  First motor     │              │  Second motor    │
│  component 401   │              │  component 402   │
└──────────────────┘              └──────────────────┘

┌──────────────────┐              ┌──────────────────┐
│  Universal       │              │  Hinge component │
│  structure 30    │              │  1011            │
└──────────────────┘              └──────────────────┘
```

FIG. 22

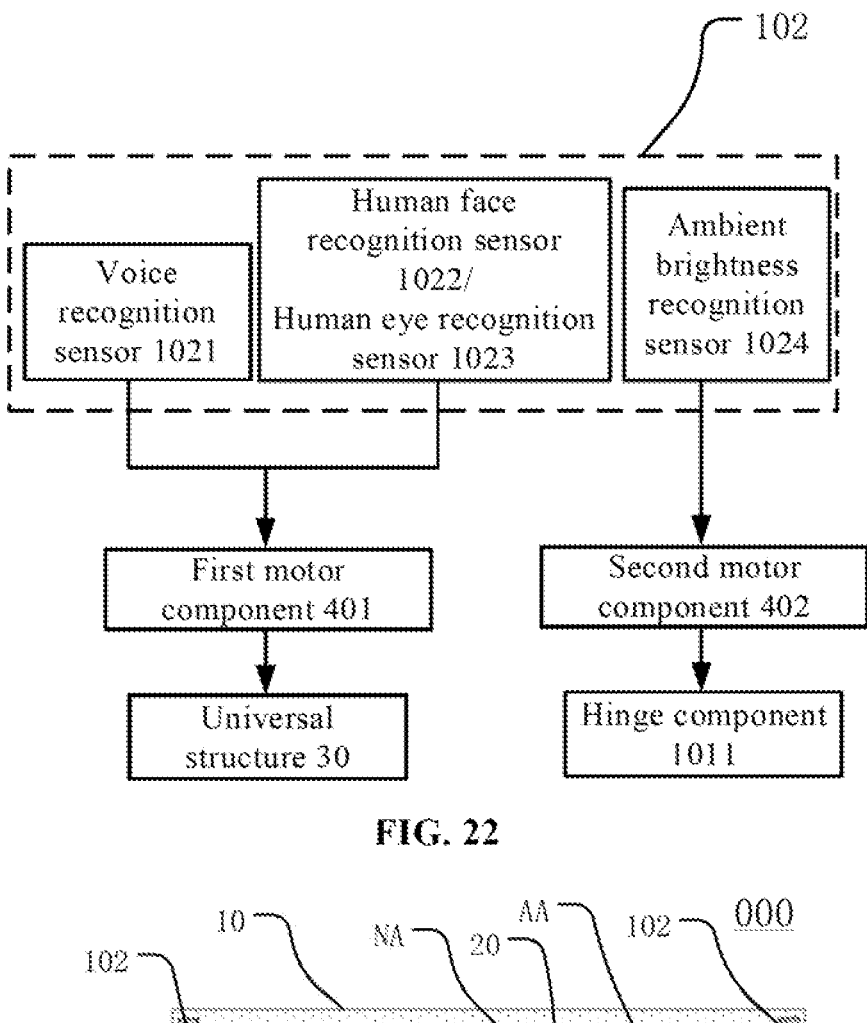

FIG. 23

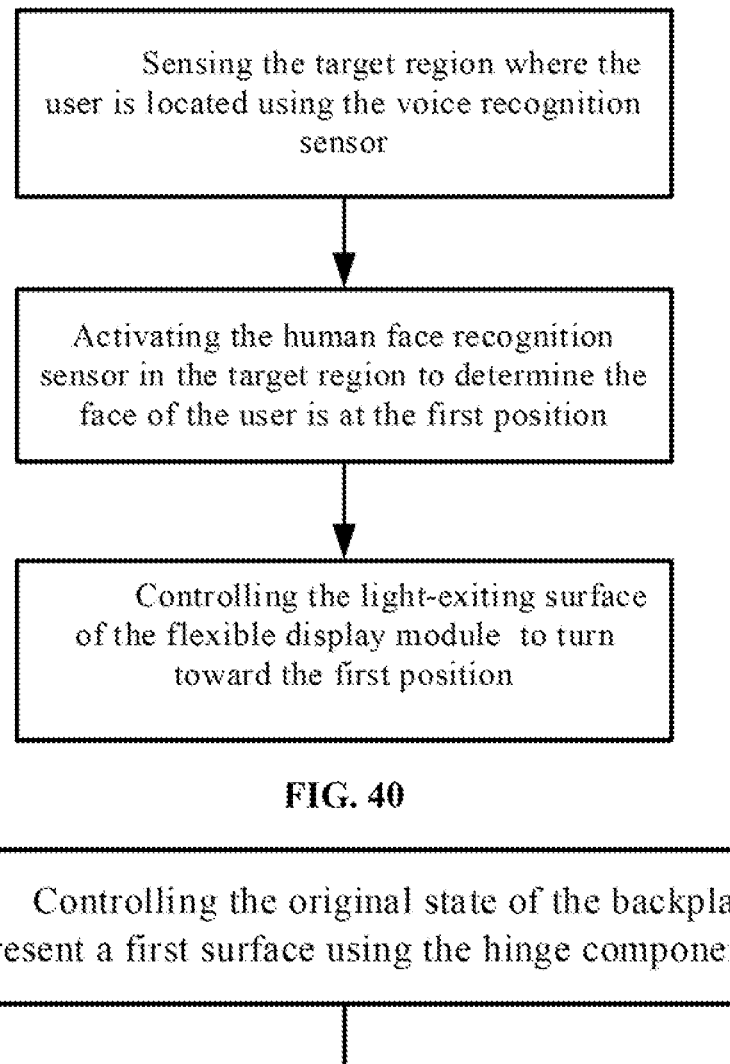

Sensing the target region where the user is located using the voice recognition sensor Activating the human face recognition sensor in the target region to determine the face of the user is at the first position Controlling the light-exiting surface of the flexible display module to turn toward the first position

FIG. 40

Controlling the original state of the backplate to present a first surface using the hinge component Sensing the location of the user using the sensor device Controlling the supporting backplate to present a second surface to cause a curvature of the second surface to be greater than a curvature of the first surface using the hinge component

FIG. 41

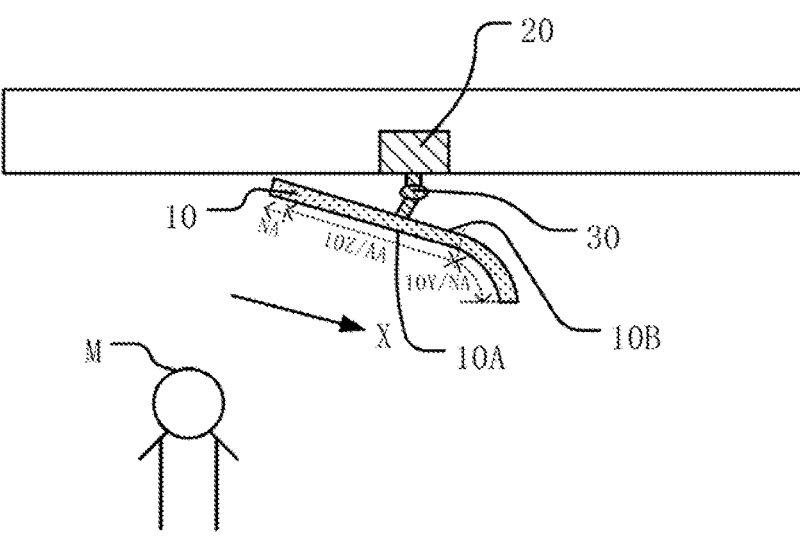

FIG. 42

```
┌─────────────────────────────────────────────┐
│   The hinge component control the original   │
│   state of the supporting backplate to       │
│   present a first surface                    │
└─────────────────────────────────────────────┘
                     │
┌─────────────────────────────────────────────┐
│   The sensor device senses the position of   │
│   the user                                   │
└─────────────────────────────────────────────┘
                     │
┌─────────────────────────────────────────────┐
│   The hinge component controls the supporting│
│   backplate to present a second surface to   │
│   cause a curvature of the second surface to │
│   be greater than a curvature of the first   │
│   surface                                    │
└─────────────────────────────────────────────┘
            │                      │
```

| The flexible display module includes a middle region and edge regions at two sides of the middle regions, the ambient light sensed by the ambient light recognition sensor is C1 and the hinge component control the curvature of the light-exiting surface of the flexible display module to be at a first gear position | The flexible display module includes a middle region and edge regions at two sides of the middle regions, the ambient light sensed by the ambient light recognition sensor is C2 and the hinge component control the curvature of the light-exiting surface of the flexible display module to be at a second gear position; and C2>C1 |
|---|---|

FIG. 43

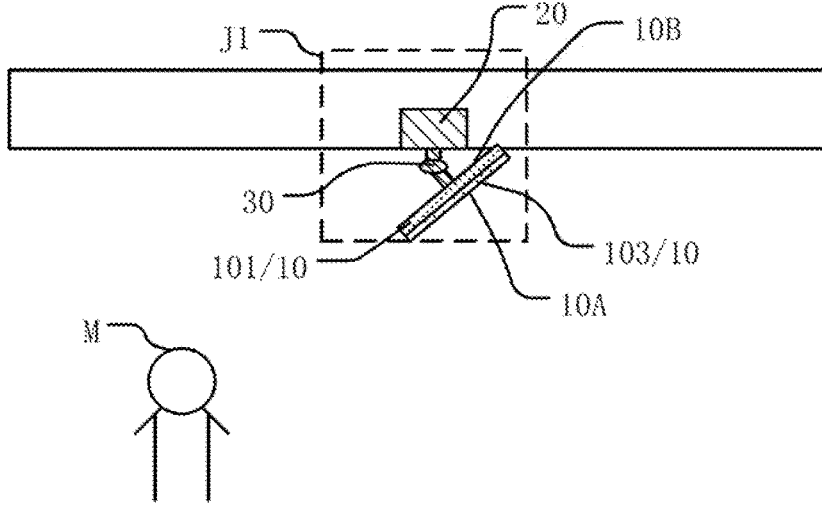

FIG. 44

Under the security mode, the flexible display module does not work, or the first motor assembly control the universal structure to turn to cause the light-exiting surface of the flexible display module to face away from the user

↓

Under the operation mode the first motor component control the universal structure to turn to drive the light-exiting surface of the display module to turn toward the user

↓

The sensor device senses the position of the user

↓

The first motor assembly control the universal structure to turn , the light-exiting surface of the flexible display module faces the user

FIG. 45

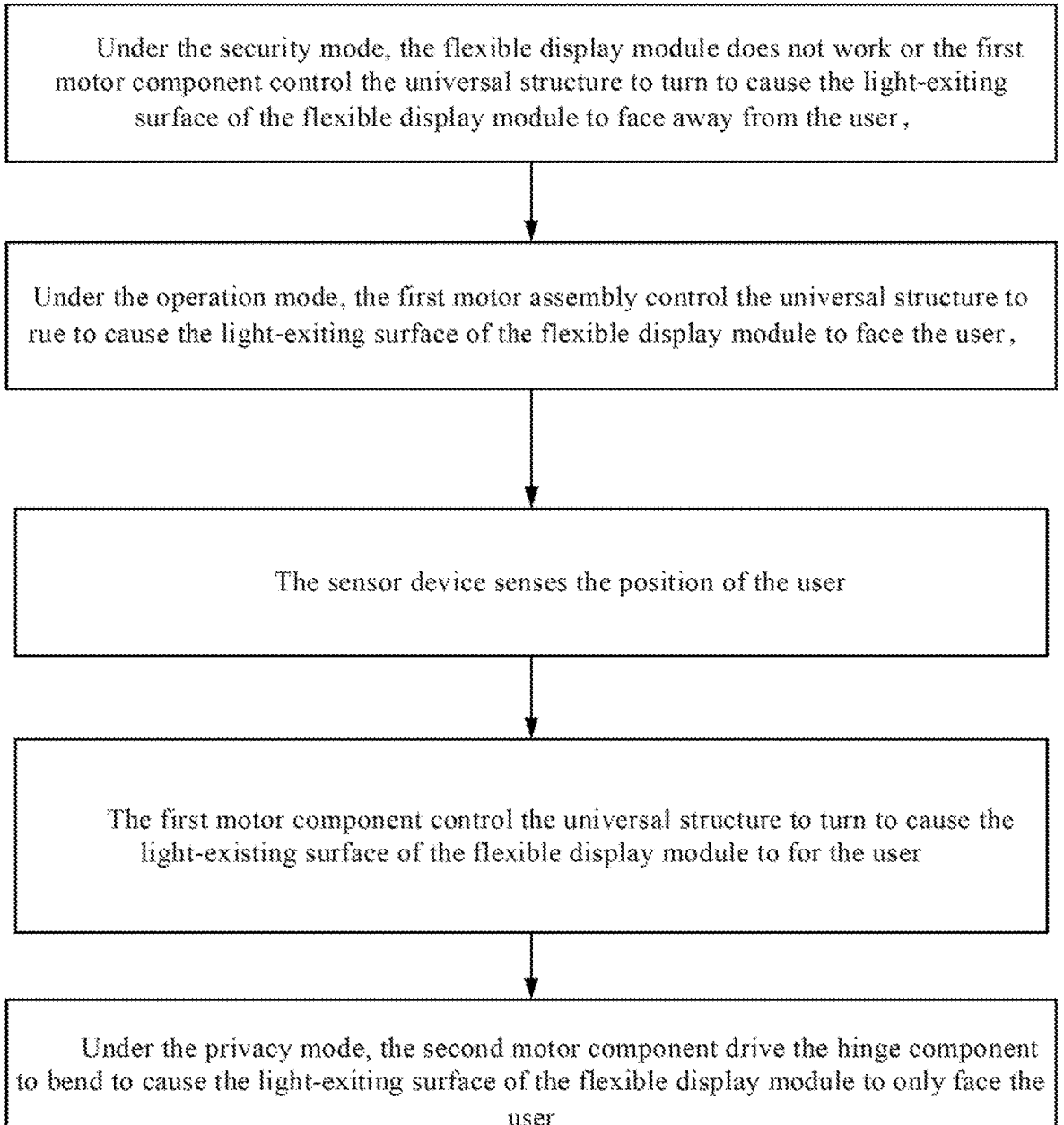

Under the security mode, the flexible display module does not work or the first motor component control the universal structure to turn to cause the light-exiting surface of the flexible display module to face away from the user, Under the operation mode, the first motor assembly control the universal structure to rue to cause the light-exiting surface of the flexible display module to face the user, The sensor device senses the position of the user The first motor component control the universal structure to turn to cause the light-existing surface of the flexible display module to for the user Under the privacy mode, the second motor component drive the hinge component to bend to cause the light-exiting surface of the flexible display module to only face the user

FIG. 46

DISPLAY DEVICE AND METHOD FOR CONTROLLING DISPLAY DEVICE

CROSS-REFERENCE TO RELATED APPLICATION

This application claims the priority of Chinese Patent Application No. 202310289370.0, filed on Mar. 22, 2023, the content of which is incorporated by reference in its entirety.

TECHNICAL FIELD

The present disclosure generally relates to the field of display technologies and, more particularly, relates to a display device and a method for controlling a display device.

BACKGROUND

The multifunctional steering wheel in the early vehicles generally uses mechanical switches to realize the interaction with the vehicle, and then realize the control of related electronic systems, resulting in the lack of intelligent information display function of the vehicle, which cannot meet the requirements of convenient operation for drivers and passengers to driving information and related auxiliary intelligent. Based on the aforementioned problems, the central control panel in the vehicle has added an intelligent display function, and the driver can realize the human-vehicle interaction function through the operation of the intelligent display system of the central control panel. At present, liquid crystal display (LCD) screens are mostly used for vehicle-mounted display screens. LCD display technology is relatively mature and can meet the requirements of vehicle-mounted experimental conditions. At the same time, people have also put forward new requirements for vehicle-mounted displays, such as thinner and lighter, high contrast, and high color gamut. Organic light-emitting diode (OLED) has become one of the most competitive technologies in the new generation of display devices due to its wide color gamut, high contrast, energy saving, and foldability. It has a wide range of applications, such as smart wearable devices and other fields. Thus, the OLED display has gradually entered the field of vehicle display.

However, the central control screen of the vehicle is basically a straight panel display, LCD or straight OLED screen, and the screen is rigid. Thus, the angle of the screen is generally fixed and cannot be adjusted; and due to the existence of structures such as the steering wheel, the central control panel is usually set at a position far away from the driver, and the driver needs to turn his head to operate the screen during the human-vehicle interaction, causing the driver's sight to leave the driving direction while the vehicle is driving, and affecting driving safety. Further, when driving in a bright environment, such as daytime, the ambient light and the reflection of the car interior will cause the screen contrast to be low, which will affect the driver's viewing of the content displayed on the screen, and the poor viewing effect will also affect driving safety. Although the existing related technologies also use the head-up display (HUD) system to project and display various information of the vehicle on the windshield glass or two meters in front of the vehicle, that is, in the driver's direct field of vision, to improve driving safety, but the head-up display system has a complex structure and high cost, and the display method is relatively clear when the ambient light is not strong, but when the ambient light is strong, the brightness of the display device can only be increased to achieve a high enough level contrast ratio, which will significantly increase the power consumption of the display device.

Therefore, it is a technical problem to be solved urgently by those skilled in the art to provide a display device and a control method thereof that can automatically adjust the direction and angle of the screen according to the user's location, which may be conducive to improving the safety of use and may also improve the display contrast. The present disclosed display devices and method for controlling the display devices are direct to solve one or more problems set forth above and other problems in the arts.

SUMMARY

One aspect of the present disclosure provides a display device. The display device includes a flexible display module and a bracket. The flexible display module includes a supporting backplate; the supporting backplate is located on a backlight side of the flexible display module; the flexible display module also includes a plurality of sensor devices; the bracket is fixed to the supporting backplate through a universal structure; one end of the universal structure is fixed to the supporting backplate; another end of the universal structure is fixed to the bracket; the plurality of sensor devices are electrically connected to the universal structure through a first motor component; and/or, the supporting backplate includes a hinge component and the plurality of sensor devices are electrically connected to the hinge component through a second motor component.

Another aspect of the present disclosure provides a method for controlling a display device. The method included providing a display device. The display device includes a flexible display module and a bracket. The flexible display module includes a supporting backplate; the supporting backplate is located on a backlight side of the flexible display module; the flexible display module also includes a plurality of sensor devices; the bracket is fixed to the supporting backplate through a universal structure; one end of the universal structure is fixed to the supporting backplate; another end of the universal structure is fixed to the bracket; the plurality of sensor devices are electrically connected to the universal structure through a first motor component; and/or, the supporting backplate includes a hinge component and the plurality of sensor devices are electrically connected to the hinge component through a second motor component. The method also includes sensing a location of a user using the plurality of sensor devices; controlling the universal structure to turn to drive a light-exiting surface of the flexible display module to face the user using the first motor component; and/or, controlling the hinge component to bend using the second motor component to adjust a curvature of the flexible display module.

Other aspects of the present disclosure can be understood by those skilled in the art in light of the description, the claims, and the drawings of the present disclosure.

BRIEF DESCRIPTION OF THE DRAWINGS

To illustrate the technical solutions in the embodiments of the present disclosure more clearly, the following briefly introduces the accompanying drawings used in the description of the embodiments. Obviously, the accompanying drawings in the following description are only some embodiments of the present disclosure, for those of ordinary skill in the art, other drawings may also be obtained from these drawings without creative effort.

FIG. 22 illustrates a schematic diagram of another electrical connection structure between the sensor device and the hinge component in FIG. 8;

FIG. 23 illustrates another top view of an exemplary display device according to various disclosed embodiments of the present disclosure;

FIG. 40 illustrates another flowchart of an exemplary control method of a display device according to various disclosed embodiments of the present disclosure;

FIG. 41 illustrates another flowchart of an exemplary control method of a display device according to various disclosed embodiments of the present disclosure;

FIG. 42 illustrates another effect diagram of the display device shown in FIG. 27 applied to a vehicle-mounted display system;

FIG. 43 illustrates another flowchart of an exemplary control method of a display device according to various disclosed embodiments of the present disclosure;

FIG. 44 illustrates another effect diagram of the display device shown in FIG. 2 and FIG. 3 applied to a vehicle-mounted display system;

FIG. 45 illustrates another flowchart of an exemplary control method of a display device according to various disclosed embodiments of the present disclosure; and FIG. 46 illustrates another flowchart of an exemplary control method of a display device according to various disclosed embodiments of the present disclosure;

DETAILED DESCRIPTION

Various exemplary embodiments of the present disclosure will now be described in detail with reference to the accompanying drawings. It should be noted that the relative arrangements of components and steps, numerical expressions and numerical values set forth in these embodiments do not limit the scope of the present disclosure unless specifically stated otherwise.

The following description of at least one exemplary embodiment is merely illustrative in nature and in no way taken as limiting the disclosure, its application or uses.

Techniques, methods and devices known to those of ordinary skill in the relevant art may not be discussed in detail, but where appropriate, such techniques, methods and devices should be considered part of the description.

In all examples shown and discussed herein, any specific values should be construed as exemplary only, and not as limitations. Therefore, other instances of the exemplary embodiment may have different values.

It will be apparent to those skilled in the art that various modifications and variations can be made in the present disclosure without departing from the spirit or scope of the disclosure. Therefore, the present disclosure is intended to cover the modifications and variations of the present disclosure falling within the scope of the corresponding claims (technical solutions to be protected) and their equivalents. It should be noted that, the implementation manners provided in the embodiment of the present disclosure may be combined with each other if there is no contradiction.

It should be noted that like numerals and letters denote like items in the following figures, therefore, once an item is defined in one figure, it does not require further discussion in subsequent figures.

Figure 1:
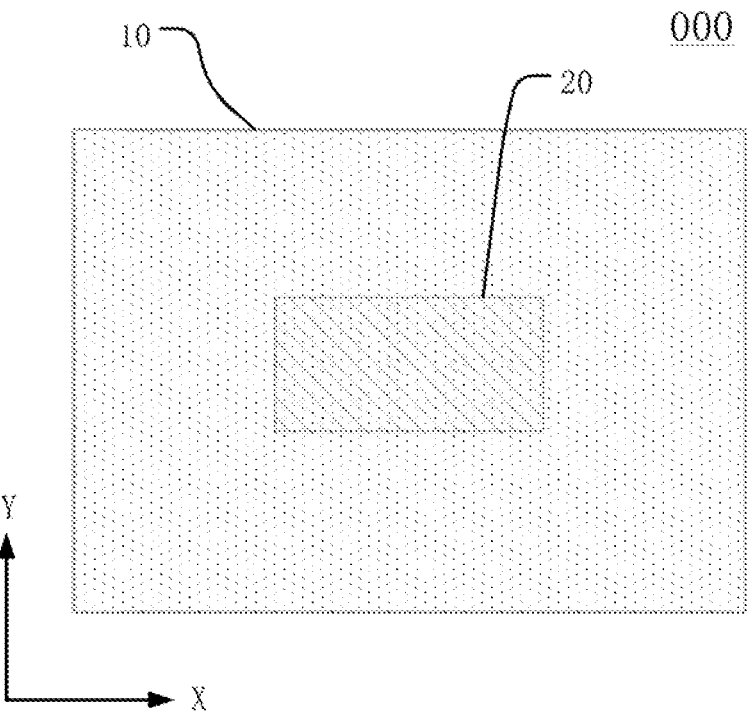
FIG. 1 illustrates a top view of an exemplary display device according to various disclosed embodiments of the present disclosure.
Figure 2:
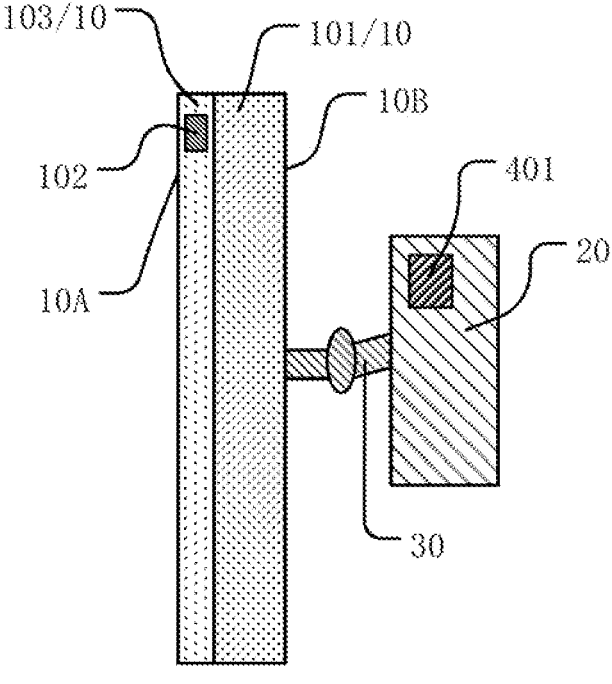
FIG. 2 illustrates a side view of the display device in FIG. 1.
Figure 3:
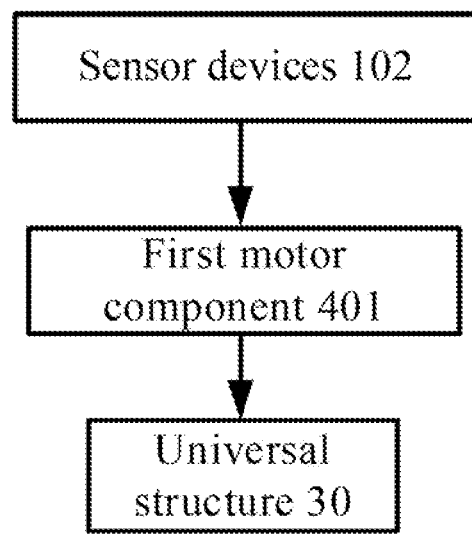
FIG. 3 illustrates a schematic diagram of an electrical connection structure between a sensor device and an universal structure in FIG. 2.
Figure 4:
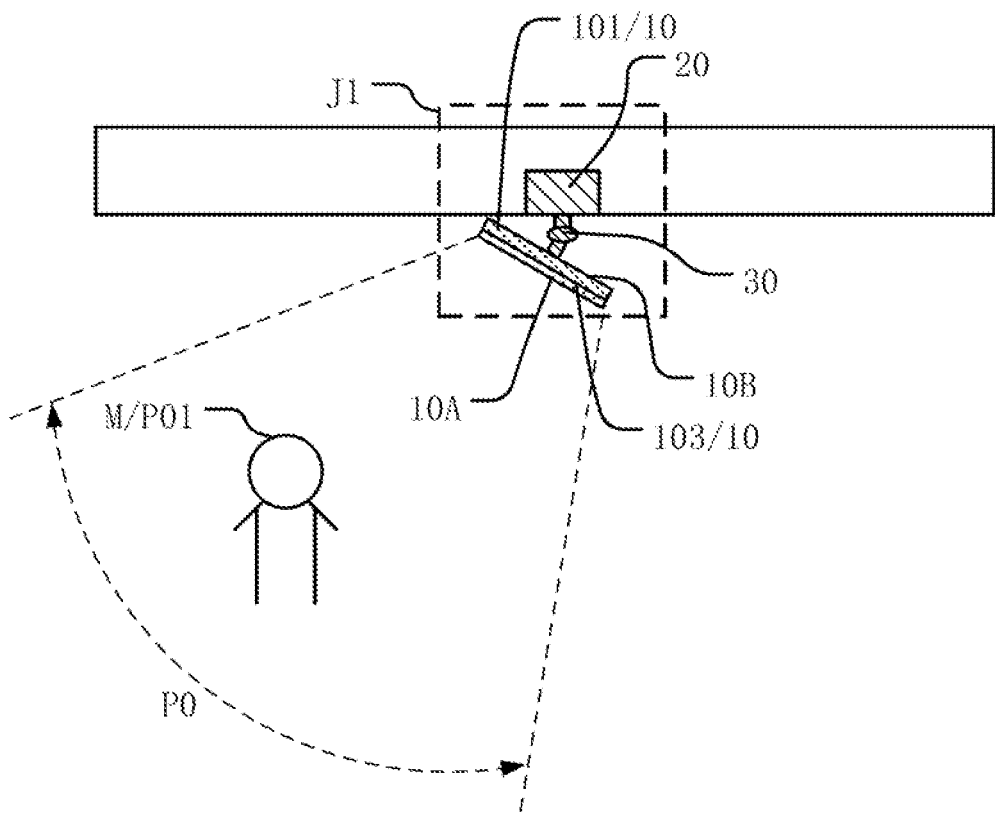
FIG. 4 illustrates an effect diagram of the display device shown in FIG. 2 and FIG. 3 applied to a vehicle-mounted display system.
Figure 5:
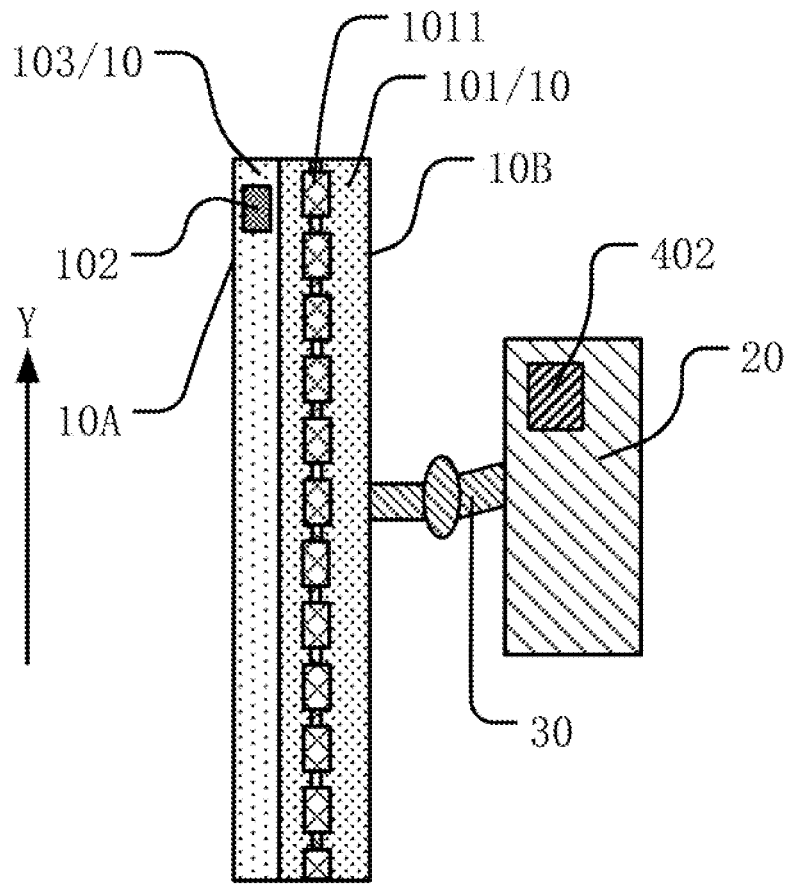
FIG. 5 illustrates another top view of the display device in FIG. 1.
Figure 6:
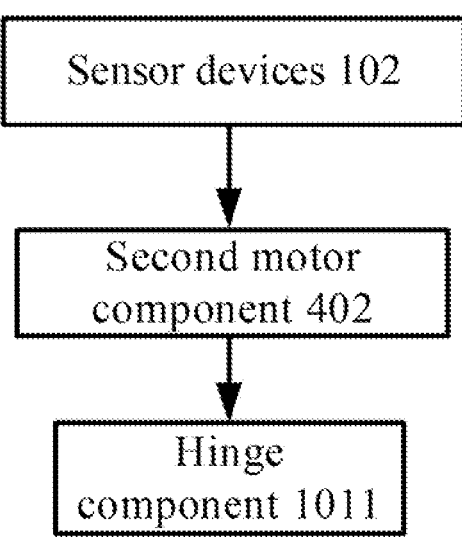
FIG. 6 illustrates a schematic diagram of an electrical connection structure between the sensor device and the hinge component in FIG. 5.
Figure 7:
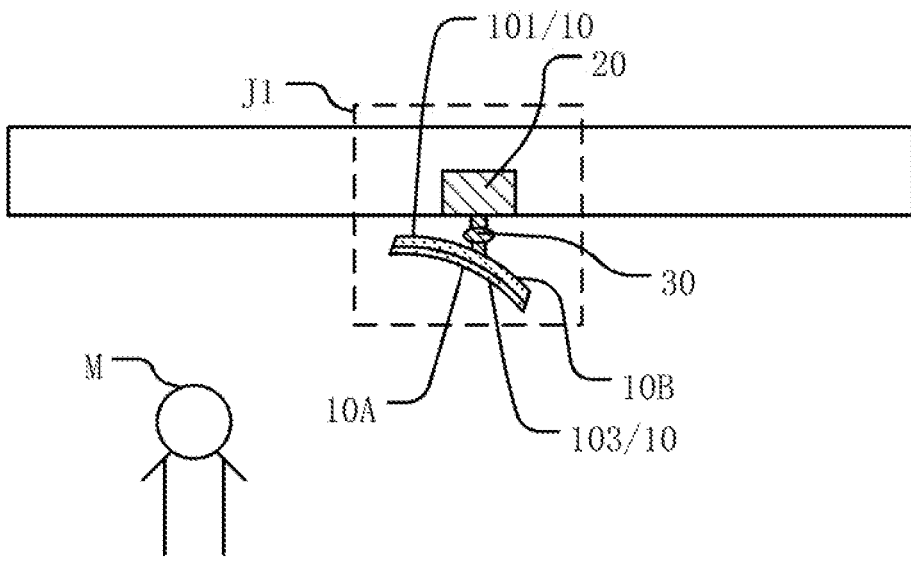
FIG. 7 illustrates an effect diagram of the display device shown in FIG. 5 and FIG. 6 applied to a vehicle-mounted display system.
Figure 8:
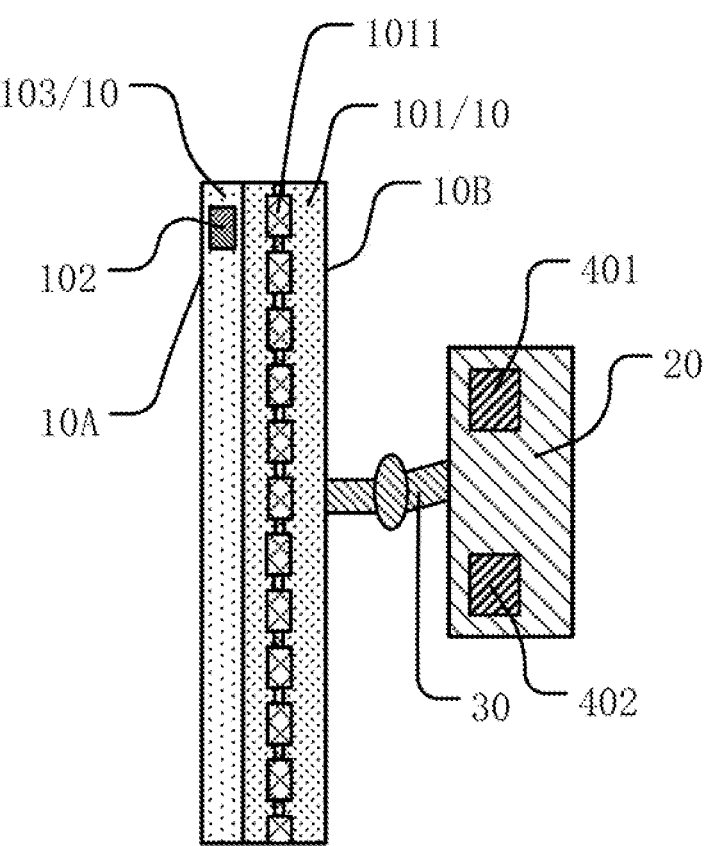
FIG. 8 illustrates another top view of the display device in FIG. 1.
Figure 9:
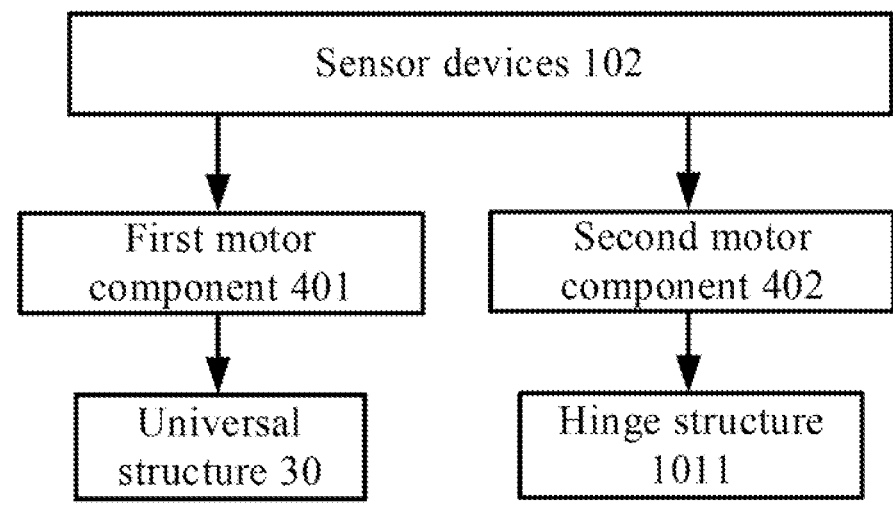
FIG. 9 illustrates a schematic diagram of an electrical connection structure between the sensor device and the hinge component in FIG. 8.
Figure 10:
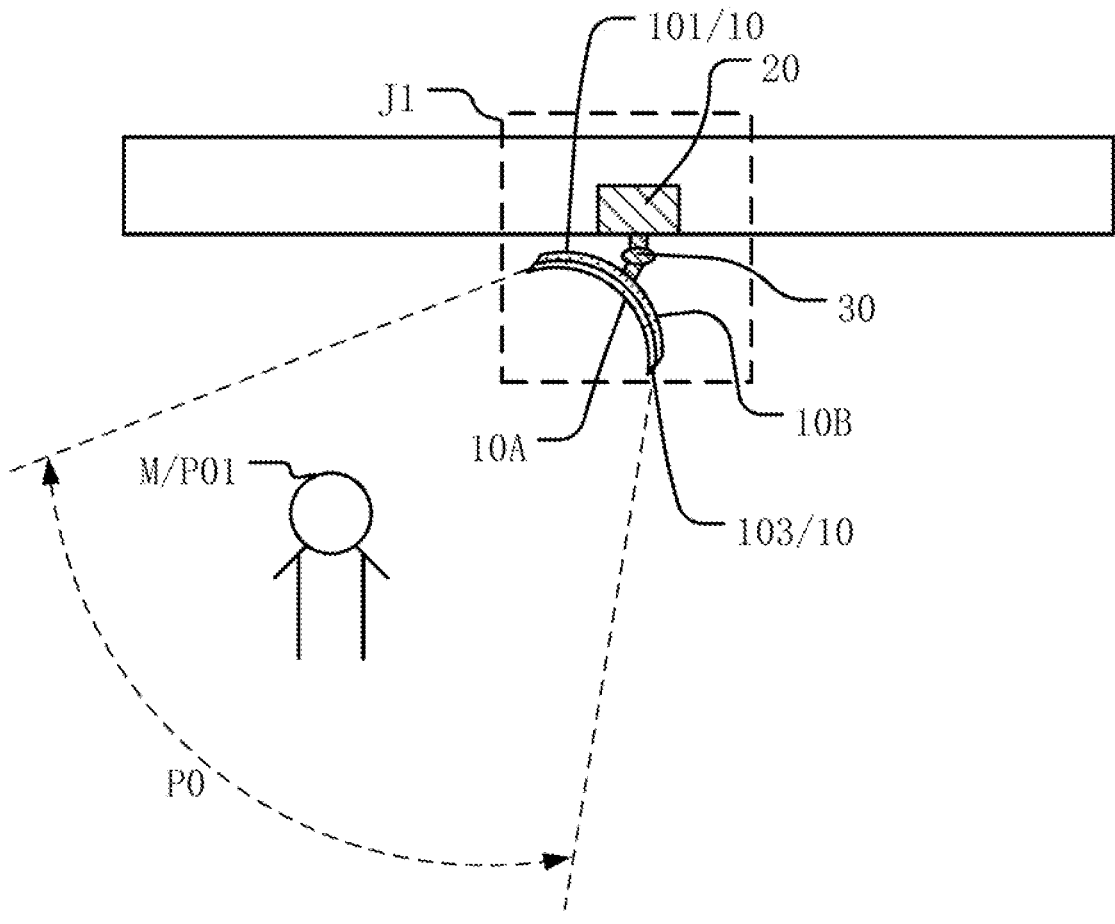
FIG. 10 illustrates an effect diagram of the display device shown in FIG. 8 and FIG. 9 applied to a vehicle-mounted display system.

FIG. 1 is a schematic top view of an exemplary display device according to various disclosed embodiments of the present disclosure. FIG. 2 is a side view of the display device in FIG. 1. FIG. 3 is a schematic view of an electrical connection structure of the sensor device and the universal structure in FIG. 2. FIG. 4 is an exemplary effect diagram of the display device shown in FIG. 2 and FIG. 3 applied in a vehicle-mounted system. FIG. 5 illustrates another side view of the display device shown in FIG. 1. FIG. 6 is a schematic diagram of an exemplary electrical connection structure between the sensor device and the hinge component in FIG. 5. FIG. 7 is an exemplary effect diagram of the display device shown in FIG. 5 and FIG. 6 applied to a vehicle-mounted display system. FIG. 8 illustrates another side view of the display device in FIG. 1. FIG. 9 is a schematic diagram of the electrical connection structure between the sensor device and the hinge component in FIG. 8. FIG. 10 is an exemplary effect diagram of the display device shown in FIG. 8 and FIG. 9 applied to a vehicle-mounted display system. As shown in in FIGS. 1-10, a display device 000 provided by the present disclosure may include a flexible display module 10 and a bracket 20. The flexible display module 10 may include a supporting backplate 101. The supporting backplate 101 may be disposed on a side of a backlight surface 10B of the flexible display module 10. The flexible display module 10 may also include a plurality of sensor devices 102.

The bracket 20 may be fixed to the supporting backplate 101 through the universal structure 30. One end of the universal structure 30 may be fixed to the supporting backplate 101, the other end of the universal structure 30 may be fixed to the bracket 20, and the plurality of sensor devices 102 may be electrically connected with the universal structure 30 through a first motor component 401 (as shown in FIGS. 2-3).

In some embodiments, the supporting backplate 101 may include a hinge component 1011. The sensor devices 102 may be electrically connected to the hinge component 1011 through a second motor component 402 (as shown in FIG. 5 and FIG. 6).

Specifically, the display device 000 provided in one embodiment of the present disclosure may include the flexible display module 10 and the bracket 20. The flexible display module 10 may be a flexible display screen. For example, the flexible display module 10 may include a supporting backplate 101. In one embodiment, the flexible display module 10 may also include a flexible display panel 103. The support backplate 101 may be provided on the side of the backlight surface 10B of the flexible display module 10. The supporting backplate 101 may be used to provide support for the flexible display panel 103. The light-exiting surface 10A of the flexible display module 10 may be the light-exiting surface of the flexible display panel 103. The flexible display panel 103 may be an organic light-emitting diode (OLED) display panel.

As shown in FIG. 1, FIG. 2 and FIG. 3, on the side of the backlight surface 10B of the flexible display module 10, one end of the universal structure 30 may be fixed to the supporting backplate 101, and the other end of the universal structure 30 may be fixed to the bracket 20. The bracket 20 may be fixed to the supporting backplate 101 through the universal structure 30, and the turning of the supporting backplate 101 may be controlled through the universal structure 30. Accordingly, the turning of the flexible display module 10 may be controlled. The display device 000 may be a display device used in a vehicle-mounted display system, and the display device 000 may be installed in the central control panel area of the vehicle-mounted display system through the bracket 20. In one embodiment, the universal structure 30 may be a universal shaft or a mechanical arm structure, and the universal shaft or the mechanical arm may rotate in one direction or in multiple directions, which is not limited in this embodiment, and may only needs to satisfy that, after the universal structure 30 is fixed to the supporting backplate 101, the steering of the support backplane 101 may be controlled through the universal structure 30. The flexible display module 10 may also include a plurality of sensor devices 102. In one embodiment, the plurality of sensor devices 102 may all be arranged in the non-display area of the flexible display module 10, or the plurality of sensor devices 102 may be partially arranged in the flexible display area. The side of the backlight surface 10B of the display module 10 may also be arranged at other positions, which is not limited in this embodiment, as long as the plurality of sensor devices 30 included in the flexible display module 10 may not affect the display effect on the side of the light-exiting surface 10A, and at the same time, the sensing effect of the sensor devices 102 may not be affected.

In one embodiment, the sensor devices 102 may be electrically connected to the universal structure 30 through the first motor component 401, and the feedback information sensed by the sensor devices 102, such as the user's position feedback, and/or sound feedback, etc., may be transmitted to the first motor component 401, the first motor component 401 may transfer the kinetic energy to the universal structure 30 through calculation, and the universal structure 30 may change its direction. Accordingly, the first motor component 401 may control the universal structure 30, and then control the direction of the supporting backplate 101 to change the turning direction of the flexible display module 10 to make the light-exiting surface 10A of the flexible display module 10 face the user as much as possible, and to achieve a better viewing angle for the user.

As shown in FIG. 4, when the display device 000 is applied to the central control panel area J1 in the vehicle-mounted display system, even if the display device 000 is far away from the position of the driver M, it may direct the light-exiting surface 10A of the flexible display module 10 toward the driver M through the first motor component 401 in time according to the position of the driver M (as shown in FIG. 4, which illustrates the effect that the light-exiting surface 10A facing the driver M after the first electrical motor component 401 controls the universal structure 401 to turn). Accordingly, the driver may watch the display screen of the light-exiting surface 10A of the flexible display module 10 without turning his head during human-vehicle interaction, and perform a screen operation when necessary. Thus, it may prevent the driver's sight from leaving the driving direction during the operation of the vehicle, which may be beneficial to improve driving safety.

In one embodiment, the first motor component 401 may be installed on the side of the backlight surface 10B of the flexible display module 10 (not shown in the drawings), or the first motor component 401 may also be installed inside the bracket 20 (as shown in FIG. 2), to avoid affecting the light output effect of the display device 000. It may be only required that the first motor component 401 is electrically connected to the sensor devices 102 and the universal structure 30 respectively.

In some embodiments, as shown in FIG. 1, FIG. 5 and FIG. 6, the flexible display module 10 may include a hinge component 1011 disposed in the supporting backplate 101. The hinge component 1011 may include a plurality of hinges, and each hinge may include a plurality of chain links. It can be understood that the structure of the hinge component 1011 may not be limited in this embodiment, only that when the hinge component 1011 may be arranged in the supporting backplate 101, and the support backplate 101 may be changed by bending the hinge component 1011, thereby changing the bending degree of the entire flexible display module 10. The display device 000 may be a display device used in a vehicle-mounted display system, and the display device 000 may be installed in the central control panel area of the vehicle-mounted display system through the bracket 20. The flexible display module 10 may also include a plurality of sensor devices 102. In one embodiment, the plurality of sensor devices 102 may be arranged in the non-display area of the flexible display module 10, or the plurality of sensor devices 102 may be partially arranged in the flexible display area. The side of backlight surface 10B of the display module 10 may also be arranged at other positions, which is not limited in this disclosure, as long as the plurality of sensor devices 102 included in the flexible display module 10 may not affect the flexible display module 10. In addition to the display effect on the side of the light-exiting surface 10A, the sensing effect of the sensor device 102 may not be affected.

In one embodiment, the sensor devices 102 may be electrically connected to the hinge component 1011 through a second motor component 402, and the feedback information sensed by the sensor device 102, such as the user's position feedback, and/or sound feedback, etc., may be transmitted to the second motor component 402. After the second motor component 402 transmits the kinetic energy to the hinge component 1011 through calculation, the hinge component 1011 may change the degree of curvature, such as changing from a flat surface to a curved surface, or from a curved surface with a smaller curvature to a curved surface with a larger curvature, to control the hinge component 1011 through the second motor component 402, and then control the bending degree of the supporting backplate 101 to change the bending degree of the flexible display module 10. By setting the light-exiting surface 10A of the flexible display module 10 as a curved surface, the light-exiting surface 10A of the flexible display module 10 may face the user as much as possible to achieve a better viewing angle for the user. As shown in FIG. 7, when the display device 000 is applied to the central control panel area J1 of the vehicle-mounted display system, even if the display device 000 is far away from the driver M, it may still control the light-exiting surface 10A of the flexible display module 10 into a curved shape and then face the driver M through the control of the second motor component 402 and the hinge component 1011 in time according to the driver M's position (FIG. 7 illustrates the effect that the light-exiting surface 10A of the flexible display module 10 is facing the driver M after the second motor component 402 controls the hinge component 1011 to bend). Accordingly, the driver may watch the display screen of the light-exiting surface 10A of the flexible display module 10 without turning his head during the human-vehicle interaction, and perform screen operations when necessary, and the driver's sight may be prevented from leaving the driving direction during operating the vehicle, which may be conducive to improving driving safety.

In one embodiment, the second motor component 402 may be installed on the side of the backlight surface 10B of the flexible display module 10 (not shown in the drawings), or the second motor component 402 may also be installed inside the bracket 20 (as shown in FIG. 5), to avoid affecting the light-emitting effect of the display device 000. It may be only required that the second motor component 402 is electrically connected to the sensor device 102 and the hinge component 1011 respectively.

In some embodiments, as shown in FIG. 1, FIG. 8 and FIG. 9, on the side of the backlight surface 10B of the flexible display module 10, one end of the universal structure 30 may be fixed to the supporting backplate 101, and the other end of the universal structure 30 may be fixed to the bracket 20. The bracket 20 may be fixed to the supporting backplate 101 through the universal structure 30, and the steering of the supporting backplate 101 may be controlled through the universal structure 30, thereby controlling the steering of the flexible display module 10. A hinge component 1011 may also be provided in the supporting backplate 101, and the hinge component 1011 may include multiple hinges, and each hinge may include multiple chain links. It can be understood that the structure of the hinge component 1011 is not limited in the present disclosure, and only needs to meet the requirements of the hinge component 1011. When the hinge component 1011 are disposed inside the supporting backplate 101, the bending degree of the supporting backplate 101 may be changed by bending the hinge component 1011, thereby changing the bending degree of the entire flexible display module 10. The display device 000 may be a display device used in a vehicle-mounted display system, and the display device 000 may be installed in the central control panel area of the vehicle-mounted display system through the bracket 20. In one embodiment, the universal structure 30 may be a universal shaft or a mechanical arm structure, and the universal shaft or the mechanical arm structure may rotate in one direction or in multiple directions, which is not limited, and may only need to satisfy that, after the universal structure 30 is fixed to the supporting backplate 101, the steering of the supporting backplate 101 may be controlled through the universal structure 30. The flexible display module 10 may also include a plurality of sensor devices 102. In one embodiment, the plurality of sensor devices 102 may be arranged in the non-display area of the flexible display module 10, or the plurality of sensor devices 102 may be partially arranged in the flexible display area. The side of the backlight surface 10B of the display module 10 may also be arranged at other positions, which is not limited in the present disclosure, as long as the plurality of sensor devices 102 included in the flexible display module 10 do not affect the flexible display module 10, and in addition to the display effect on the side of the light-exiting surface 10A, the sensing effect of the sensor devices 102 may not be affected.

In one embodiment, the sensor devices 102 may be electrically connected to the universal structure 30 through the first motor component 401, and the sensor devices 102 may also be electrically connected to the hinge component 1011 through the second motor component 402. The feedback information sensed by the sensor devices 102, such as the user's position feedback, and/or sound feedback and other information, may be transmitted to the first motor component 401. After the first motor component 401 transmits the kinetic energy to the universal structure 30 through calculation, the universal structure 30 may change its direction to control the universal structure 30 through the first motor component 401, and then control the steering of the supporting backplate 101 to change the steering of the flexible display module 10. At the same time, the feedback information sensed by the sensor devices 102, such as the user's position feedback, and/or sound feedback, etc., may also be transmitted to the second motor component 402. After the second motor component 402 transmits the kinetic energy to the hinge component 1011 through calculation, the hinge component 1011 may change the degree of bending, such as changing from a flat shape to a curved shape, or from a curved shape with a smaller curvature to a curved shape with a larger curvature, to control the hinge component 1011 through the second motor component 402, and further control the bending degree of the supporting backplate 101, while the direction of the light-exiting surface 10A of the flexible display module 10 changes, the bending degree of the flexible display module 10 may be changed. By setting the light-exiting surface 10A of the flexible display module 10 as a curved surface, the light-exiting surface 10A of the flexible display module 10 may be further oriented toward the user to achieve a better viewing angle for the user.

As shown in FIG. 9, when the display device 000 is applied to the central control panel area J1 of the vehicle-mounted display system, even if the display device 000 is far away from the driver M, the light-exiting surface 10A of the flexible display module 10 may be steered toward the driver M at a better angle through the control of the first motor component 401, the universal structure 30, the second motor component 402 and the hinge component 1011 in time according to the driver M's position. Accordingly, the driver may not need to turn his head when interacting with the vehicle. That is, the display screen of the light-exiting surface 10A of the flexible display module 10 may be viewed, and the screen operation may be performed when necessary. Thus, the driver's sight may be prevented from leaving the driving direction during vehicle driving, which may be conducive to further improving driving safety. Further, when the flexible display module 10 is controlled by the universal structure 30 such that its light-exiting surface 10A may face the user, the hinge component 1011 may control the light-exiting surface 10A of the flexible display module 10 to have different bending degrees, which may also play a role of blocking the ambient light within the viewing range of the viewer, and may be beneficial to improve the contrast when the user watches the display device 000. Accordingly, the user may achieve the best viewing effect as much as possible, and the user satisfaction may be improved. Further, the structure of the display device in the present disclosure may be simplified, and there is no need to set up a head-up display system with high cost and high power consumption, which may be beneficial to cost saving.

In one embodiment, the first motor component 401 and the second motor component 402 may be installed on the side of the backlight surface 10B of the flexible display module 10 (not shown in the drawings), or the first motor component 401 and the second motor component 402 may also be installed inside the bracket 20 (as shown in FIG. 8) to avoid affecting the light-exiting effect of the display device 000. It may only need to meet the requirements that the first motor component 401 is electrically connected to the sensor devices 102 and the universal structure 30 respectively, and the second motor component 402 may be electrically connected to the sensor devices 102 and the hinge component 1011 respectively.

It can be understood that the figure of this embodiment only shows the structure of the flexible display module 10 as an example. In practice, the flexible display module 10 may not only include a flexible display panel 103 and a supporting backplate 101, but may also include other functional structures, details can be understood with reference to the structure of the flexible display screen in the related art, which will not be repeated in this embodiment.

Figure 11:
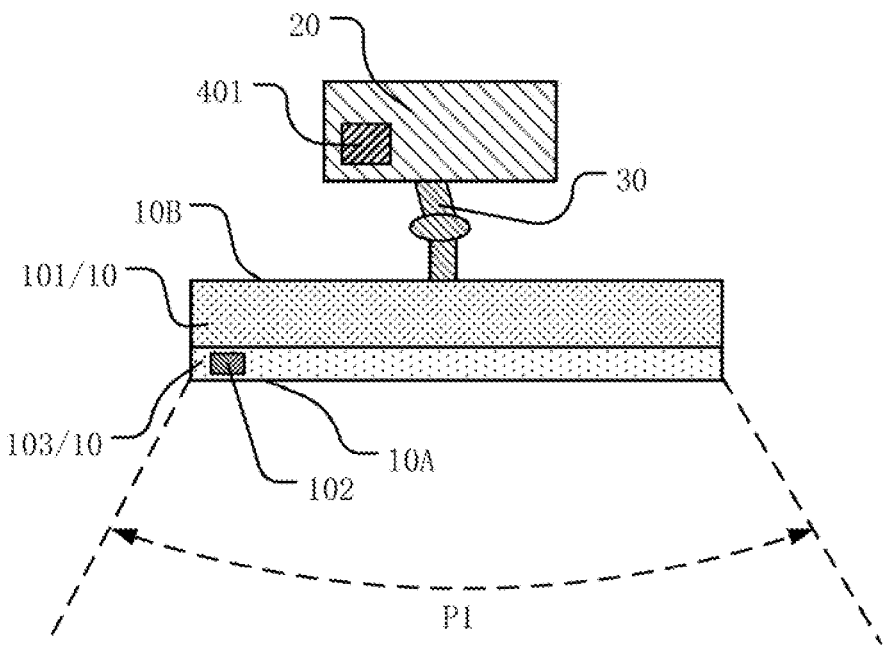
FIG. 11 illustrates a schematic structural diagram of the display device shown in FIG. 2 and FIG. 3 under a first working mode.
Figure 12:
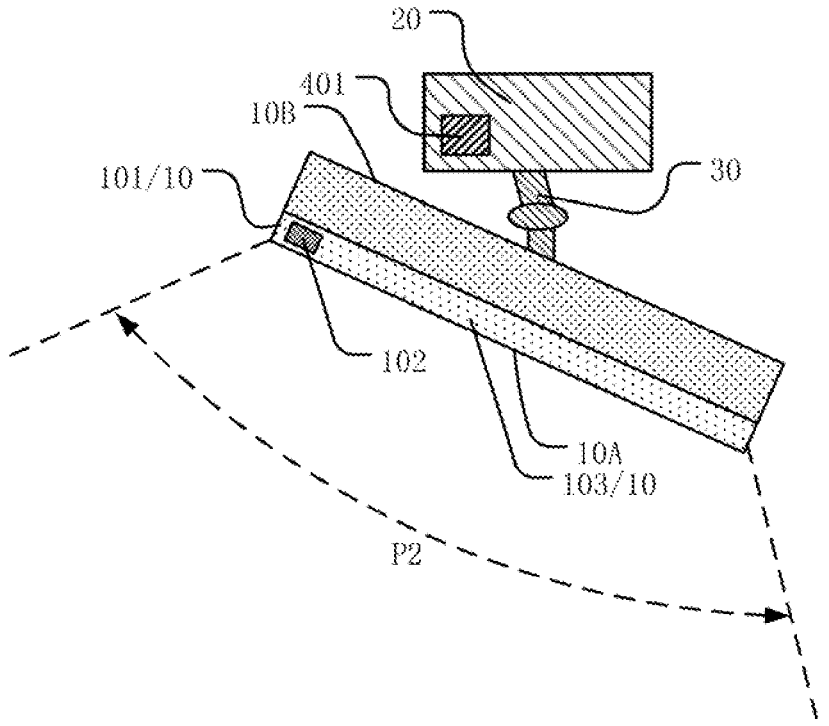
FIG. 12 illustrates a schematic structural diagram of the display device shown in FIG. 2 and FIG. 3 under a second working mode.

FIG. 11 is a schematic structural diagram of the display device shown in FIG. 2 and FIG. 3 under a first working mode, and FIG. 12 is a schematic diagram of the display device shown in FIG. 2 and FIG. 3 under a second working mode. As shown in FIG. 1, FIGS. 2-3 and FIGS. 11-12, in some embodiments, the display device 000 may include the first working mode and the second working mode. As shown in FIG. 11, under the first working mode, the universal structure 30 may control the light-exiting surface 10A of the flexible display module 10 to turn toward the first region P1. As shown in FIG. 12, under the second working mode, the universal structure 30 may control the light-exiting surface 10A of the flexible display module 10 to turn toward the second region P2. The positions of the first region P1 and the second region P2 may be different. In one embodiment, the first area P1 may be understood as the original orientation area of the display device 000 in the original state, for example, when the universal structure 30 does not receive a rotation command. The second area P2 may be understood as the area where the sensor device 102 in the display device 000 senses the position of the user and the universal structure 30 faces after receiving the rotation command.

Figure 13:
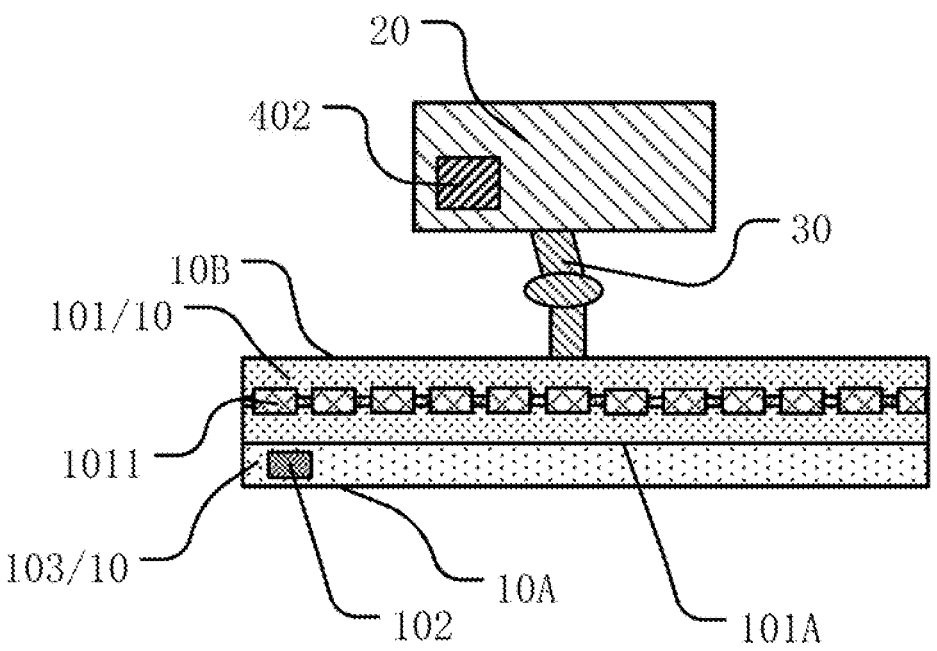
FIG. 13 illustrates a schematic structural diagram of the display device shown in FIG. 5 and FIG. 6 under a first working mode.
Figure 14:
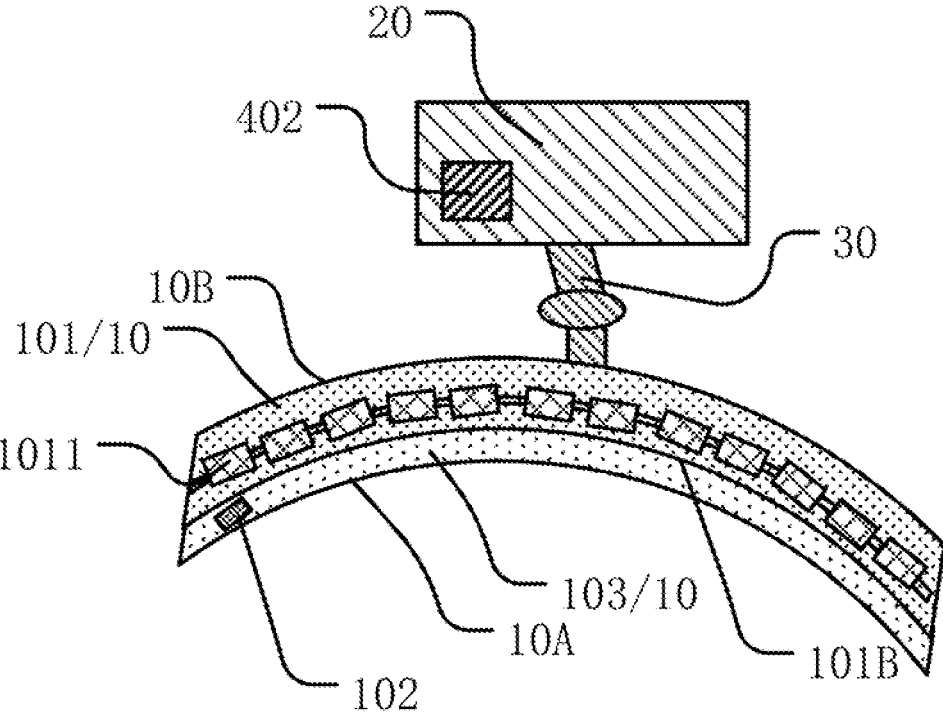
FIG. 14 illustrates a schematic structural diagram of the display device shown in FIG. 5 and FIG. 6 under a second working mode.

FIG. 13 is a schematic structural diagram of the display device shown in FIG. 5 and FIG. 6 under the first working mode. FIG. 14 is the structural schematic diagram of the display device shown in FIG. 5 and FIG. 6 under the second working mode. As shown in FIG. 1, FIGS. 5-7, and FIGS. 13-14, in one embodiment, the display device 000 may include the first working mode and the second working mode. As shown in FIG. 13, under the first working mode, the hinge component 1011 may control the supporting backplate 101 to present a first surface 101A. As shown in FIG. 14, under the second working mode, the hinge component 1011 may control the supporting backplate 101 to present the second surface 101B. The curvature of the first surface 101A and the curvature of the second surface 101B may be different. In one embodiment, the first surface 101A may be a flat or a curved surface. FIG. 13 uses a flat surface as an example. The curvature of the first surface 101A may be greater than the curvature of the second surface 101B, i.e., the degree of curvature may be different. Further, the supporting backplate 101 having the first surface 101A may be understood as the original state of the display device 000, for example, the original state when the hinge component 1011 does not receive a bending instruction, and the supporting backplate 101 having the second surface 101B may be understood the position of the user sensed by the sensor device 102 in the display device 000, and the status when the hinge component 1011 changes the state of the curvature after receiving the bending command may be changed.

Figure 15:
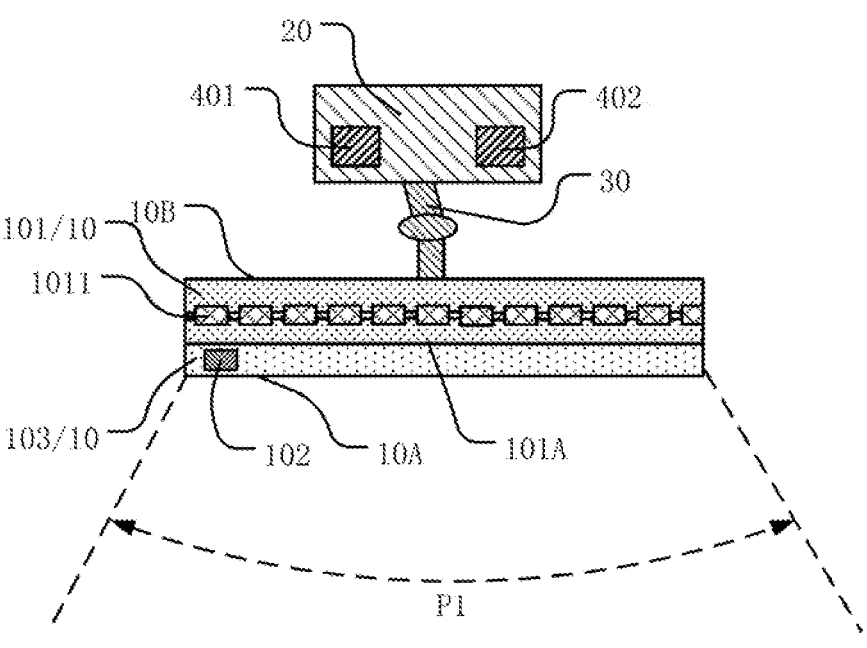
FIG. 15 illustrates a schematic structural diagram of the display device shown in FIG. 7 and FIG. 8 under a first working mode.
Figure 16:
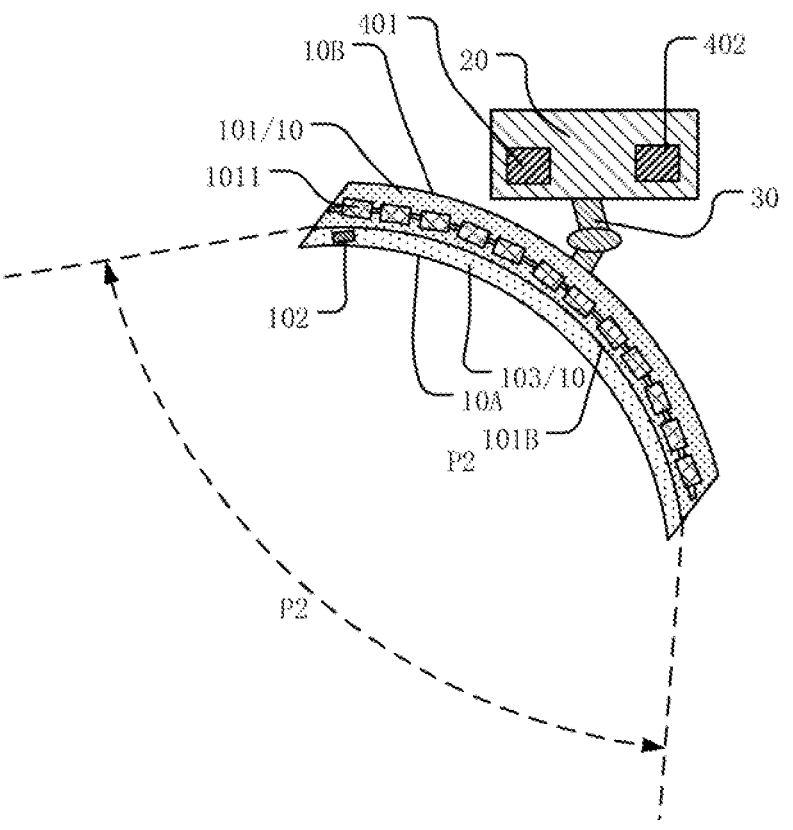
FIG. 16 illustrates a schematic structural diagram of the display device shown in FIG. 7 and FIG. 8 under a second working mode.

FIG. 15 is a schematic structural diagram of the display device shown in FIG. 7 and FIG. 8 under the first working mode. FIG. 16 is a schematic diagram of the display device shown in FIG. 7 and FIG. 8 under the second working mode. As shown in FIG. 1, FIGS. 5-7, and FIGS. 13-14, in one embodiment, the display device 000 may include the first working mode and the second working mode. As shown in FIG. 15, under the first working mode, the universal structure 30 may control the light-emitting surface 10A of the flexible display module 10 to turn toward the first area P1, and the hinge component 1011 may control the supporting backplate 101 to present the first surface 101A. As shown in FIG. 16, in the second working mode, the universal structure 30 may control the light-emitting surface 10A of the flexible display module 10 to turn toward the second region P2, and the hinge component 1011 may control the supporting backplate 101 to form the second surface 101B. The positions of the first region P1 and the second region P2 may be different, and the curvature of the first surface 101A and the curvature of the second surface 101B may be different. The first region P1 may be understood as the original orientation region of the display device 000 in the original state, for example, the area where the universal structure 30 faces without receiving a rotation instruction, and the state when the supporting backplate 101 presents the first surface 101A may be the original state of the display device 000 when the hinge component 1011 does not receive a bending command. The second region P2 may be understood as the position of the user sensed by the sensor devices 102 in the display device 000, and the area faced by the universal structure 30 after receiving the rotation command. The state that the supporting backplate 101 presents the second surface 101B may be the state where the sensor devices 102 in the display device 000 sense the position of the user, and the state the hinge component 1011 further bends and changes the curvature after receiving the bending command. Accordingly, the joint adjustment of the universal structure 30 and the hinge component 1011 may jointly achieve the best viewing angle of the screen for the user, and better improve the safety of use and the display effect.

Figure 17:
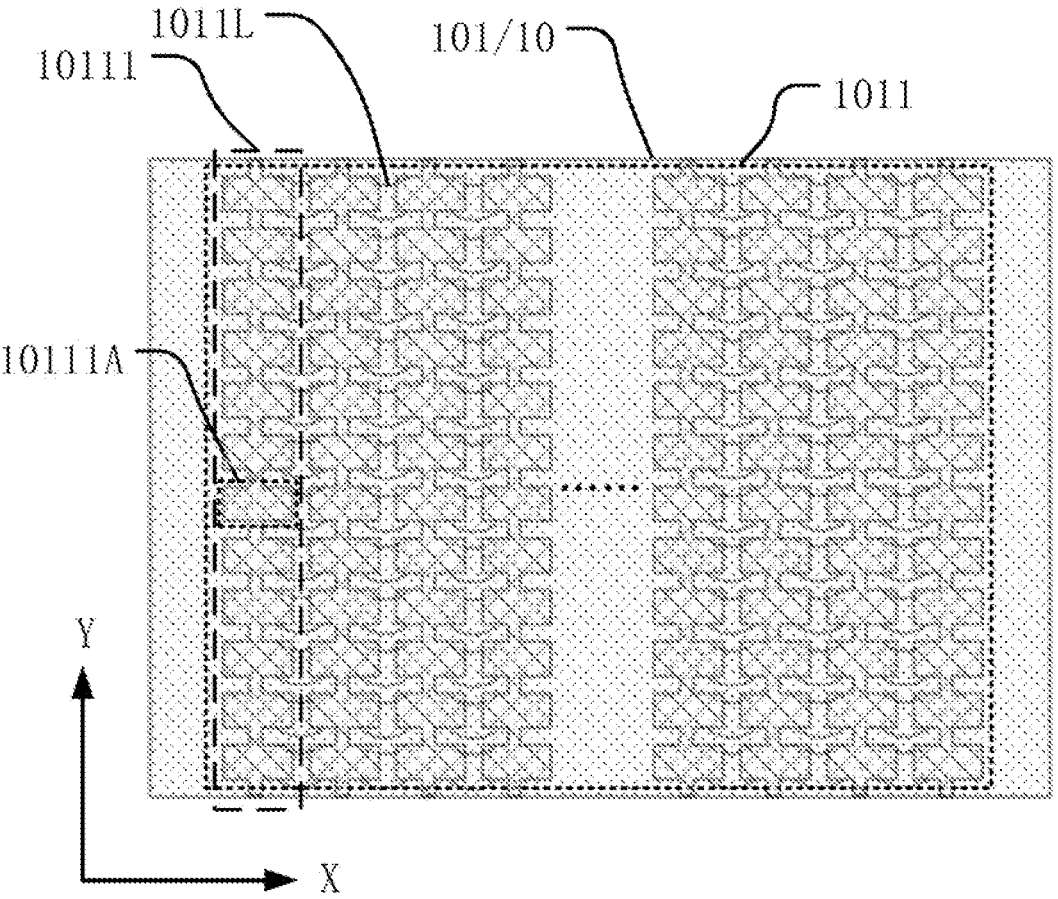
FIG. 17 illustrates a schematic top view of a supporting backplate in FIG. 5.

FIG. 17 is a schematic top view of the supporting backplate in FIG. 5 (filled with transparency in FIG. 17 for better illustration). As shown in FIG. 1, FIGS. 5-6 and FIG. 17, in one embodiment, the hinge component 1011 may include a plurality of hinges 10111 arranged along a first direction X, and a hinge 10111 may include a plurality of chain links 10111A connected to each other in a second direction Y. The second direction Y may be the extension direction of the central axis around which the hinge component 1011 is bent, and the first direction X may intersect the second direction Y. In FIG. 17, the first direction X and the second direction Y are perpendicular to each other as an example for illustration.

This embodiment explains that the structure of the hinge component 1011 included in the supporting backplane 101 of the display device 000 may be selected as follows: the hinge component 1011 may include a plurality of hinges 10111 arranged along the first direction X, and the plurality of hinges 10111 arranged along the first direction X may be connected to each other through the connection member 1011L. Each hinge 10111 may be provided with a plurality of chain links 10111A connected to each other in the second direction Y. When the hinge component 1011 needs to be bent around the central axis in the second direction Y, the connection member 1011L may be controlled by the second motor component 402 to drive the two adjacent hinges 10111 to form different angles such that the hinge component 1011 may be bent around the central axis along the second direction Y to realize the bending control of the supporting backplate 101.

Figure 18:
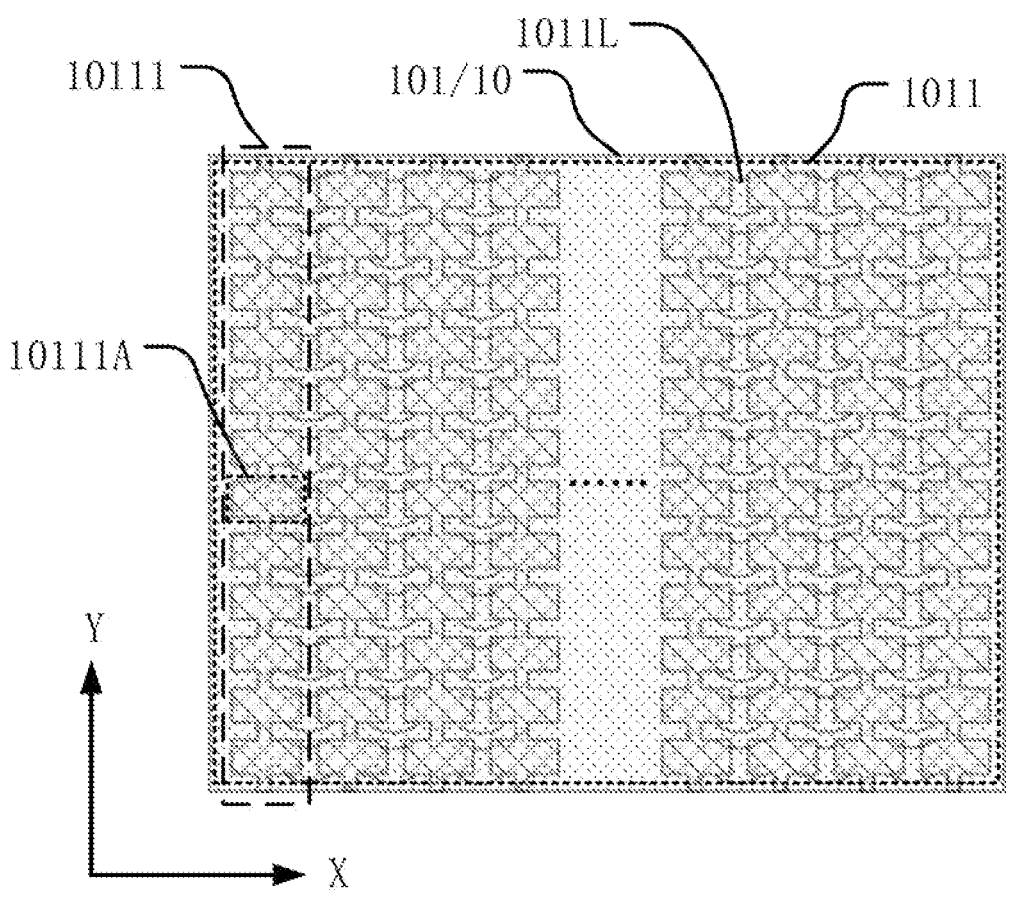
FIG. 18 illustrates another schematic top view of a supporting backplate in FIG. 5.

FIG. 18 is a schematic diagram of another exemplary top review of the supporting backplate in FIG. 5. As shown in FIG. 1, FIGS. 5-6 and FIG. 18, in one embodiment, the orthographic projection of the hinge component 1011 on the light-exiting surface 10A of the flexible display module 10 may cover the entire area where the flexible display module 10 is located, for example, the bending curvature of the area where the flexible display module 10 is located may all be controlled by the hinge component 1011, not only the middle area of the flexible display module 10, but also the edge areas on both sides of the flexible display module 10 in the first direction X may be controlled to change the curvature by the hinge component 1011 to bend the edge areas on both sides of the flexible display module 10 in the first direction X, which may be beneficial to ensure the omnidirectional bendability of the flexible display module 10.

It can be understood that this embodiment does not repeat the specific connection structure of the hinge component 1011 in the display device 000, and the specific implementation can be understood according to the hinge structure capable of changing the curvature of the flexible display module in the related art.

Figure 19:
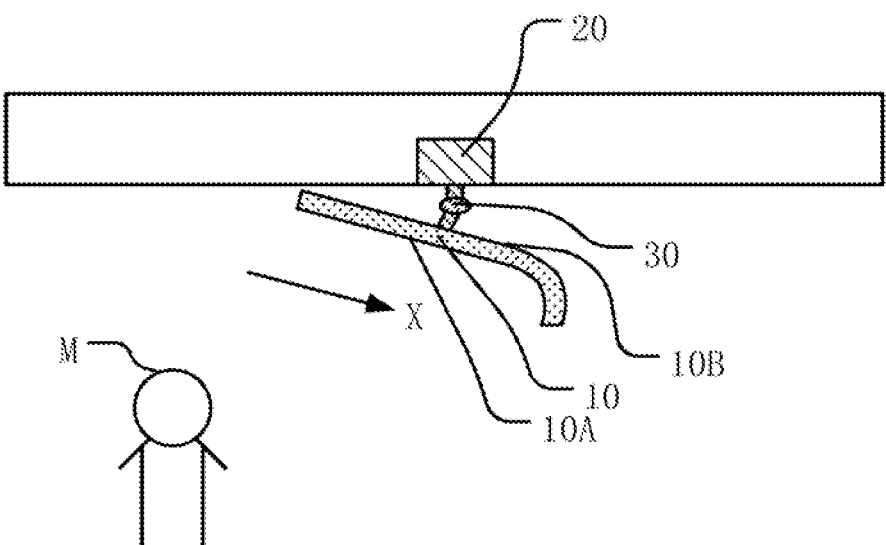
FIG. 19 illustrates another effect diagram of the display device shown in FIG. 8 and FIG. 9 applied to a vehicle-mounted display system.
Figure 20:
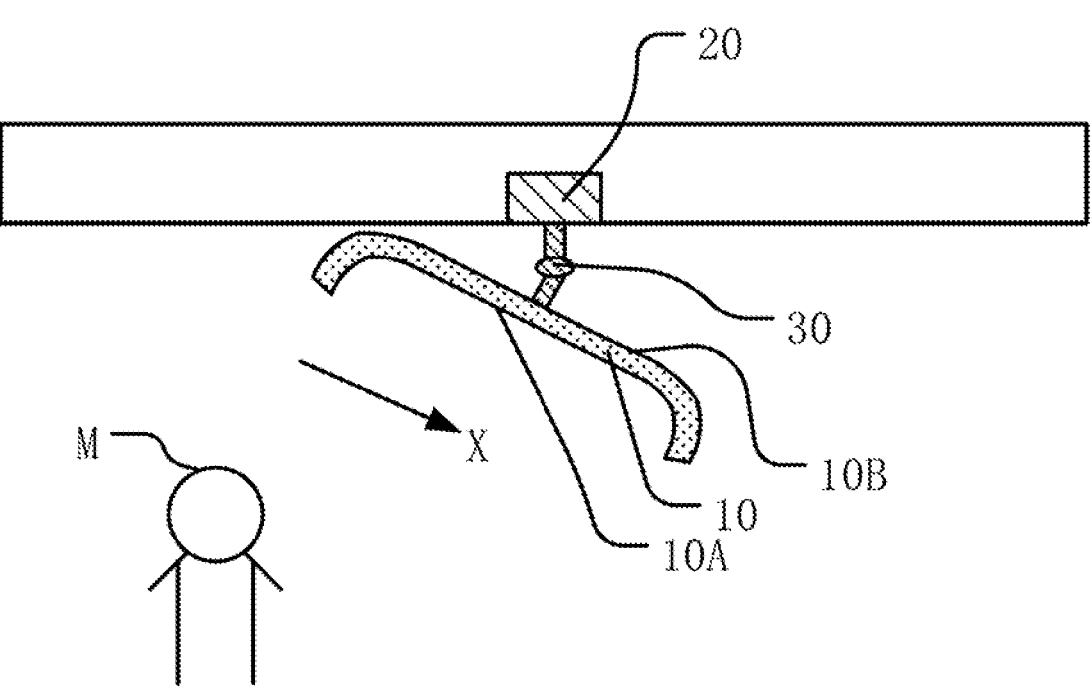
FIG. 20 illustrates another effect diagram of the display device shown in FIG. 8 and FIG. 9 applied to a vehicle-mounted display system.

It should be noted that the above-mentioned FIGS. 5-10 are only schematic diagrams illustrating a bending state in which the supporting backplate 101 is controlled by the hinge component 1011. In specific implementations, the supporting backplate 101 may drive the flexible display module 10 to bend and present different bending curvatures including but is not limited thereto, as shown in FIG. 19. FIG. 19 is another exemplary effect diagram of the display device shown in FIG. 8 and FIG. 9 applied to a vehicle-mounted display system. As shown in FIG. 19, the hinge component 101 may also be possible to only control the bending of the edge area of the flexible display module 10 on the side away from the driver M in the first direction X, to form a shielding effect on this side, which may be beneficial to privacy protection. FIG. 20 is another exemplary effect diagram of the display device shown in FIG. 8 and FIG. 9 applied to a vehicle-mounted display system. As shown in FIG. 19, in some embodiments, the hinge component 1011 may also control the bending of both side edge regions of the flexible display module 10 in the first direction X. When the driver M watches the light-exiting surface 10A of the flexible display module 10, the surrounding ambient light may be blocked, which may be beneficial to improve the display contrast.

Figure 21:
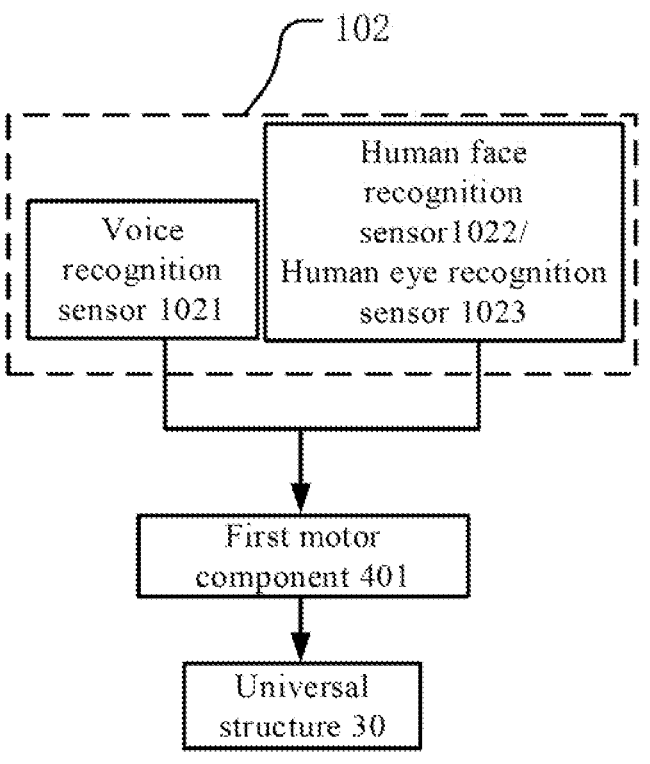
FIG. 21 illustrates a schematic diagram of another electrical connection structure between a sensor device and an universal structure in FIG. 2.

FIG. 21 is a schematic diagram of another exemplary electrical connection structure between the sensor device and the universal structure in FIG. 2. As shown in FIGS. 1-2, FIG. 4 and FIG. 21, in one embodiment, the plurality of sensor devices 102 may include a voice recognition sensor 1021, which may recognize the target area P0 where the user (such as the driver M) is located, and the universal structure 30 may control the light-exiting surface 10A of the flexible display module 10 to turn to the target area P0.

In one embodiment, the plurality of sensor devices 102 may also include a face recognition sensor 1022 or an eye recognition sensor 1023. In the target area P0, the face recognition sensor 1022 or the eye recognition sensor 1023 may recognize the first position P01 where the user (such as the driver M) is located, and the universal structure 30 may control the turning of the light-exiting surface 10A of the flexible display module 10 to the first position P01. It can be understood that the target area P0 may include the first position P01, and the target area P0 may be understood as the second area P2, for example, the area where the user is located.

This embodiment explains that, among the plurality of sensor devices 102 included in the flexible display module 10, there may be a voice recognition sensor 1021, or at least one of a human face recognition sensor 1022 or a human eye recognition sensor 1023. During the working process of the display device 000, when the user needs to perform human-computer interaction, the target area P0 where the user (such as the driver M) is located may be identified only through the voice recognition sensor 1021, and the first motor component 401 may control the light-exiting surface 10A of the flexible display module 10 through the universal structure 30 to turn toward the target area P0 first, which may be beneficial to reduce the power consumption of the display device 000. Then, the human face recognition sensor 1022 or the human eye recognition sensor 1023 may be activated, and in the above-mentioned target area P0, the human face recognition sensor 1022 or the human eye recognition sensor 1023 may recognize the accurate first position P01 of the user (such as the driver M), and the first motor component 401 may control the light-exiting surface 10A of the flexible display module 10 to turn toward the first position P01 through the universal structure 30, which may be beneficial to reduce the power consumption while accurately sensing the first position P01 where the user is located. Accordingly, the accuracy of screen steering may be improved.

It can be understood that the sound recognition sensor 1021 included in the plurality of sensors 102 in this embodiment may receive the sound source through a microphone, and the target area P0 where the user is located may be sensed by adopting the sound source localization method imitating human binaural, the sound source localization based on time difference, and the sound source localization methods based on sound pressure-amplitude ratio (specifically, the above multiple sound source localization methods may be referred to the description in the related art, and this embodiment will not go into details here). The face human recognition sensor 1022 or the human eye recognition sensor 1023 included in the plurality of sensors 102 may be a camera, such as an infrared camera that can track a heat source and identify the first position P01 of a human face or human eyes, to accurately sense the user's position, and facilitate accurate steering of the light-exiting surface 10A of the flexible display module 10. The present disclosure does not specifically limit the use types of the voice recognition sensor 1021, the face recognition sensor 1022 or eye recognition sensor 1023, which may be selected and set according to actual needs during specific implementation.

FIG. 22 is a schematic diagram of another exemplary electrical connection structure between the sensor device and the hinge component in FIG. 8. As shown in FIG. 1, FIG. 8, FIG. 10, FIG. 13, FIG. 14 and FIG. 22, in one embodiment, the plurality of sensor devices 102 may include an ambient brightness recognition sensor 1024. The ambient brightness recognition sensor 1024 may recognize that the ambient brightness, and when the ambient brightness is lower than a first threshold, the hinge component 1011 may control the supporting backplate 101 to be planar (as shown in FIG. 13). When the ambient brightness recognized by the ambient light recognition sensor 1024 is higher than a first threshold, the hinge component 1011 may control the supporting backplate 101 to be curved (as shown in FIG. 14).

This embodiment explains that, among the plurality of sensor devices 102 included in the flexible display module 10, there may be an ambient brightness recognition sensor 1024. When the ambient brightness recognition sensor 1024 recognizes that the ambient brightness is lower than the first threshold (it can be understood that the first threshold may be the preset ambient light brightness value of the display device 000, when the measured ambient light brightness is higher than the first threshold, it may cause a problem that the display contrast is too low and affects the viewing effect), the hinge component 1011 may control the supporting backplate 101 to be planar, for example, when the ambient light brightness measured by the ambient brightness recognition sensor 1024 is lower than the preset first threshold, it may not affect the display contrast and viewing effect. At this time, the hinge component 1011 may not move, and the hinge component 1011 may not need to be controlled to change the curvature of the surface of the backplate 101, and it may be a plane in the original state (as shown in FIG. 13). When the ambient brightness recognition sensor 1024 recognizes that the ambient brightness is higher than the first threshold, the hinge component 1011 may control the supporting backplate 101 to be curved, for example, when the ambient brightness measured by the ambient brightness recognition sensor 1024 is higher than the preset first threshold, there may an issue that the display contrast may be too low to affect the viewing effect, the hinge component 1011 may be used to control the surface of the supporting backplate 101 to change the curvature such that the supporting backplate 101 may drive the light-exiting surface 10A of the flexible display module 10 into a curved shape (as shown in FIG. 14). The light-exiting surface 10A of the curved flexible display module 10 may block ambient light, and improve the display contrast such that the viewer may obtain a better viewing effect.

In another embodiment, referring to FIG. 1, FIG. 8, FIG. 10 and FIG. 22, the ambient brightness sensor 1024 may detect the ambient light brightness after determining the first position P01 of the user, for example, during the working process of the display device 000, when the user needs to perform a human-computer interaction, the target area P0 where the user (such as the driver M) is located may be identified only through the voice recognition sensor 1021, and the light-emitting surface 10A of flexible display module 10 may be controlled through the universal structure 30 to first turn to the target area P0, and then the face recognition sensor 1022 or the eye recognition sensor 1023 may be activated. In the above-mentioned target area P0, the face recognition sensor 1022 or the eye recognition sensor 1023 may recognize the exact first position P01 of the user (such as driving Personnel M), and then the first motor component 401 may control the light-exiting surface 10A of the flexible display module 10 to turn toward the first position P01 through the universal structure 30, and then activate the ambient brightness sensor 1024 to identify the ambient light brightness. When necessary, the curvature may be changed by the hinge component 1011 to block the ambient light, which may be beneficial to reduce the power consumption while improving the accuracy of screen turning, and may also ensure the user's viewing effect.

It can be understood that the ambient brightness recognition sensor 1024 included in the plurality of sensors 102 in this embodiment may use a light sensor to sense the brightness value of the use environment. This embodiment does not specifically limit the type of ambient brightness recognition sensor 1024, and during implementation, settings may be selected according to actual needs.

Figure 24:
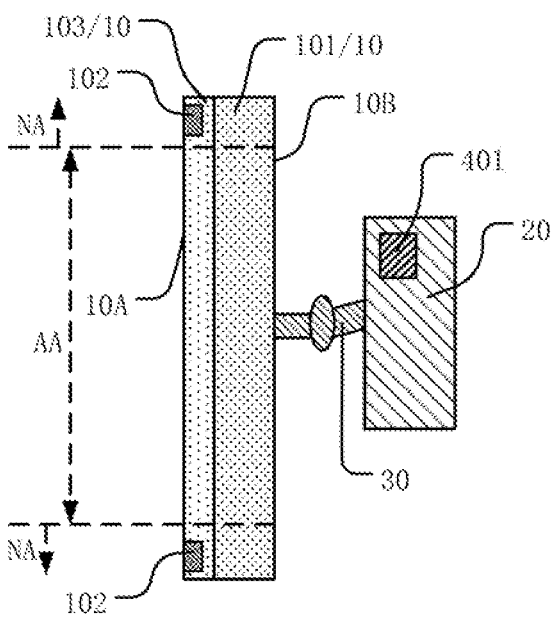
FIG. 24 illustrates a side view of the display device in FIG. 23.

FIG. 23 is a schematic top view of another exemplary display device according to various disclosed embodiments of the present disclosure. FIG. 24 is a schematic side view of the display device in FIG. 23. As shown in FIGS. 23-24, in one embodiment, the sensor devices 102 may be located in the non-display region NA of the flexible display module 10.

This embodiment explains that the plurality of sensor devices 102 included in the flexible display module 10 may be arranged on the side of the light-exiting surface 10A of the flexible display module 10. When the plurality sensor devices 102 include a face recognition sensor 1022 or a human eye recognition sensor 1023 or the ambient brightness recognition sensor 1024, they may not be blocked by the structure of the flexible display module 10 itself, which may be beneficial to ensure the sensing effect of the sensor devices 102, and when the plurality of sensor devices 102 are arranged on the side of the light-exiting surface 10A of the flexible display module 10, the plurality of sensor devices 102 may be located in the non-display region NA of the flexible display module 10, thereby preventing the arrangement of the sensor devices 102 in the flexible display module 10 from affecting the normal display screen of the display region AA of the flexible display module 10. Accordingly, the satisfaction of the user's viewing experience may be improved.

It can be understood that FIG. 23 and FIG. 24 of this embodiment only take the number of sensor devices 102 as four as an example. During specific implementations, the number of sensor devices 102 may include but not limited to this, and may be set according to the actual sensing requirements of the display device 000. FIG. 23 and FIG. 24 of this embodiment only take a plurality of sensor devices 102 located at the corners of the non-display region NA of the flexible display module 10 as an example for illustration to avoid the scan driving circuit, test circuit and other structures, etc., possibly included in the non-display region NA. During a specific implementation, the installation position of the sensor devices 102 includes but is not limited to this, it may also be installed at the non-display region NA position of other flexible display modules 10, may only need to meet the requirements of ensuring the sensing function and at the same time, not affecting the driving and display function of the flexible display module 10 itself, which is not limited in this embodiment.

Figure 25:
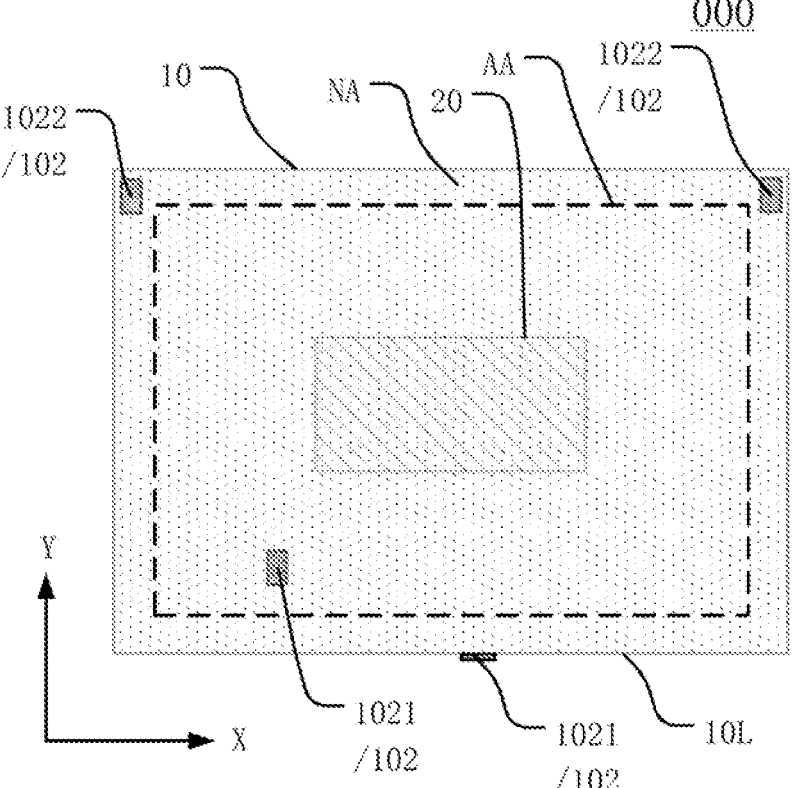
FIG. 25 illustrates another top view of an exemplary display device according to various disclosed embodiments of the present disclosure.
Figure 26:
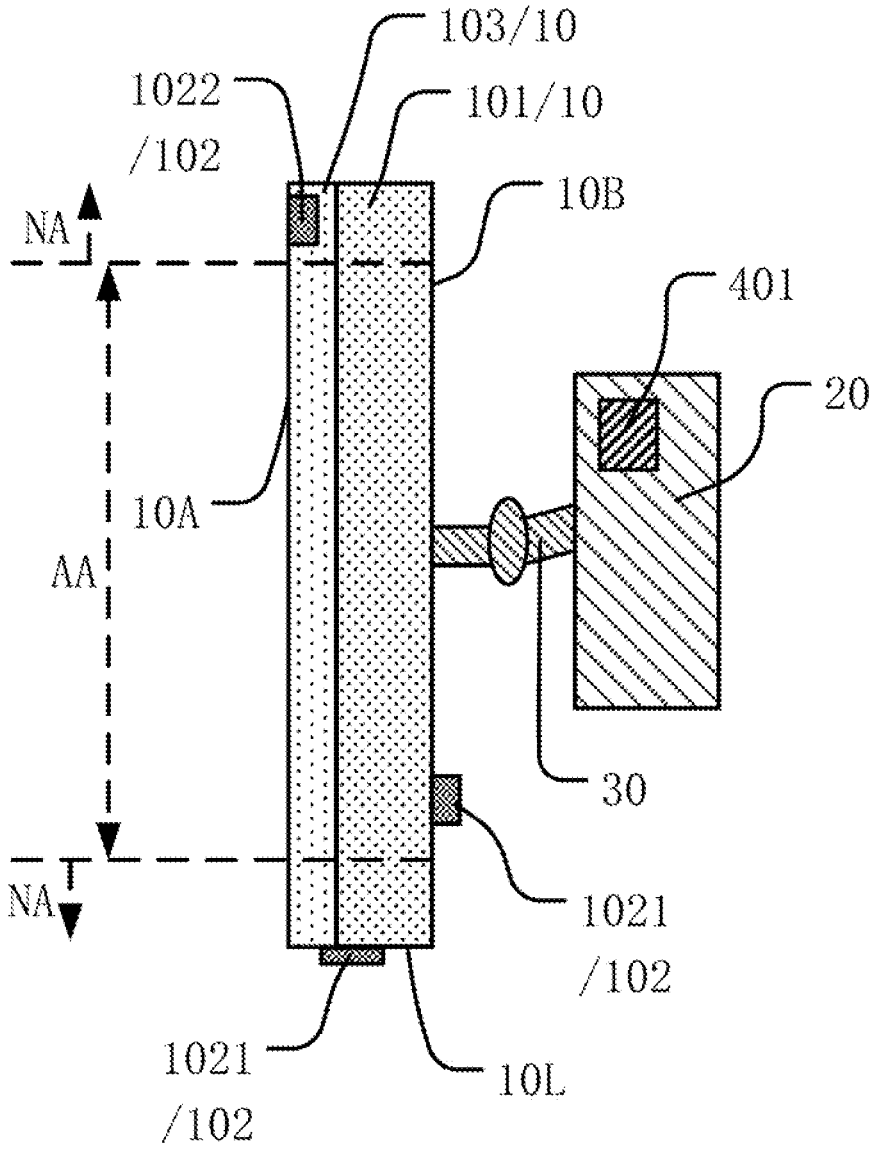
FIG. 26 illustrate a side view of the display device in FIG. 25.

FIG. 25 is another schematic top view of an exemplary display device according to various disclosed embodiments of the present disclosure. FIG. 26 is a schematic side view of the display device in FIG. 25. As shown in FIGS. 25-26, in one embodiment, the plurality sensor devices 102 may include a first sensor device 1021 and a second sensor device 1022. The first sensor device 1021 may include any one or more of voice recognition sensors and ambient brightness recognition sensors, and the second sensor device 1022 may include any one or more of human face recognition sensors and human eye recognition sensors.

The first sensor device 1021 may be arranged on the side of the backlight surface 10B of the flexible display module 10 or the edge 10L of the flexible display module 10. The second sensor device 1022 may be arranged on the side of the light-exiting surface 10A of the flexible display module 10.

This embodiment explains that the plurality of sensor devices 102 included in the flexible display module 10 may be be partially arranged on the side of the light-exiting surface 10A of the flexible display module 10, and partly arranged on the non-light-exiting surface of the flexible display module 10. Specifically, the plurality of sensor devices 102 may include a first sensor device 1021 and a second sensor device 1022. The first sensor device 1021 may be any one or more of a sound recognition sensor and an ambient brightness recognition sensor, and the second sensor device 1022 may include one or more of the face recognition sensor and the eye recognition sensor. The second sensor device 1022 that needs to collect the user's face or human eye information may be arranged on the light-exiting surface 10A of the flexible display module 10 (for example, the front side facing the user) to timely and accurately sense the user's position through the second sensor device 1022 on the side of the light-exiting surface 10A of the flexible display module 10, while the first sensor device 1021 that does not need to collect information about the user's face or eye, such as the voice recognition sensors, the ambient brightness recognition sensor, may be installed on the side of the backlight surface 10B of the flexible display module 10 or at the edge 10L of the flexible display module 10 (which can be understood as the side edge of the display module 10). Accordingly, not only the user's sound source position may be sensed through the voice recognition sensor, but also the brightness in the environment in which the display device 000 is used may be sensed through the ambient brightness recognition sensor, and the issue that the number of sensor devices 102 on the side of the light-emitting surface 10A of the display module 10 is too large and the light-exiting effect is affected may be avoided. Further, more layout space for the non-display region NA of the flexible display module 10 may be provided and the frame area may be reduced.

Figure 27:
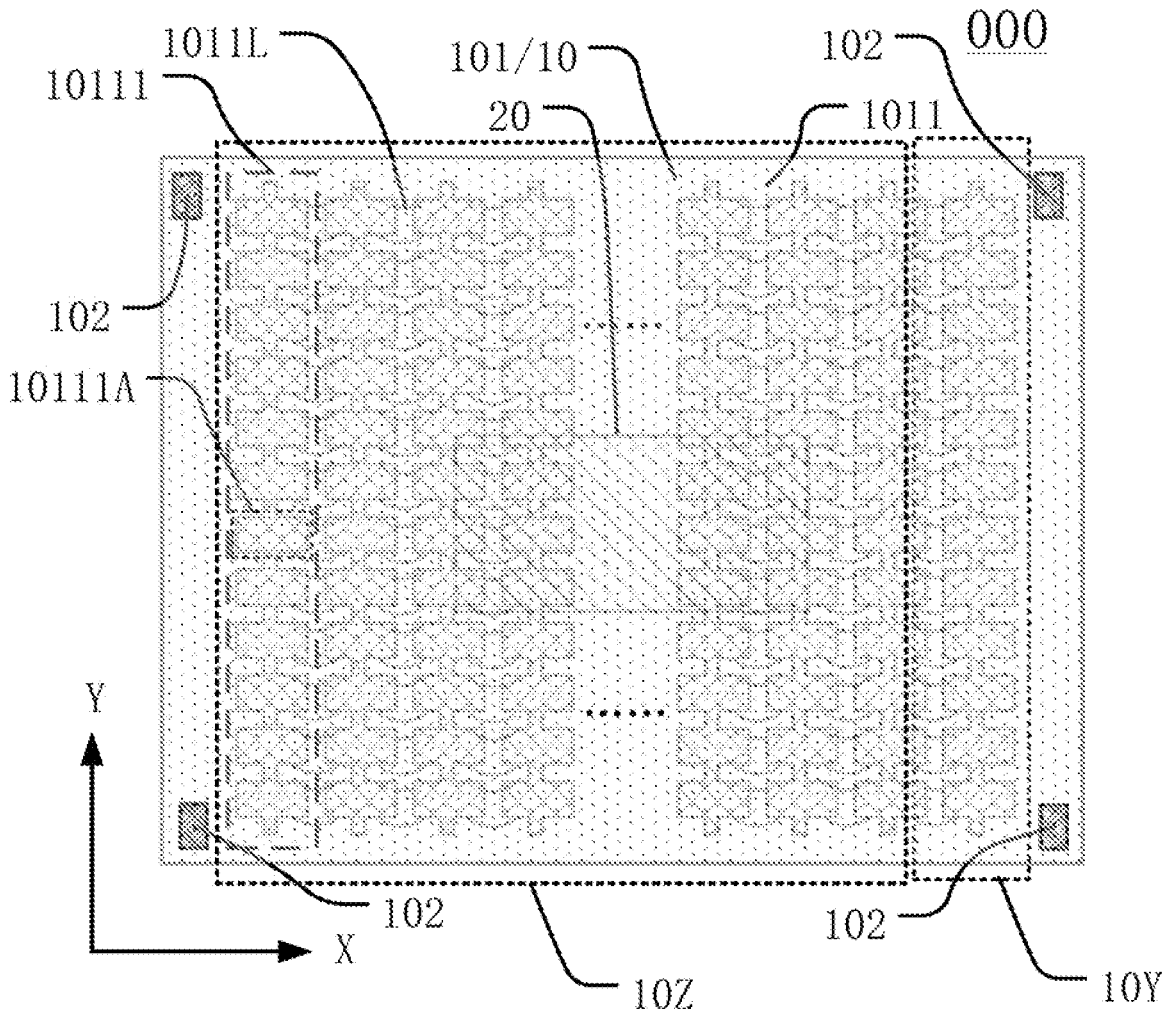
FIG. 27 illustrates another top view of an exemplary display device according to various disclosed embodiments of the present disclosure.
Figure 28:
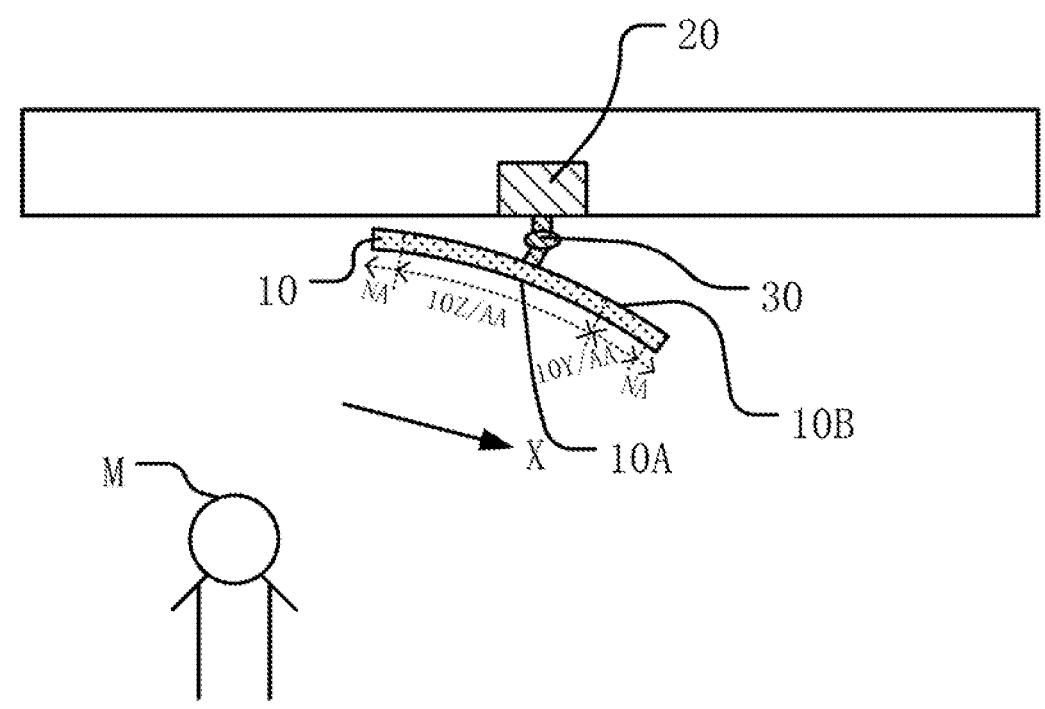
FIG. 28 illustrates another effect diagram of the display device shown in FIG. 8 and FIG. 27 applied to a vehicle-mounted display system.
Figure 29:
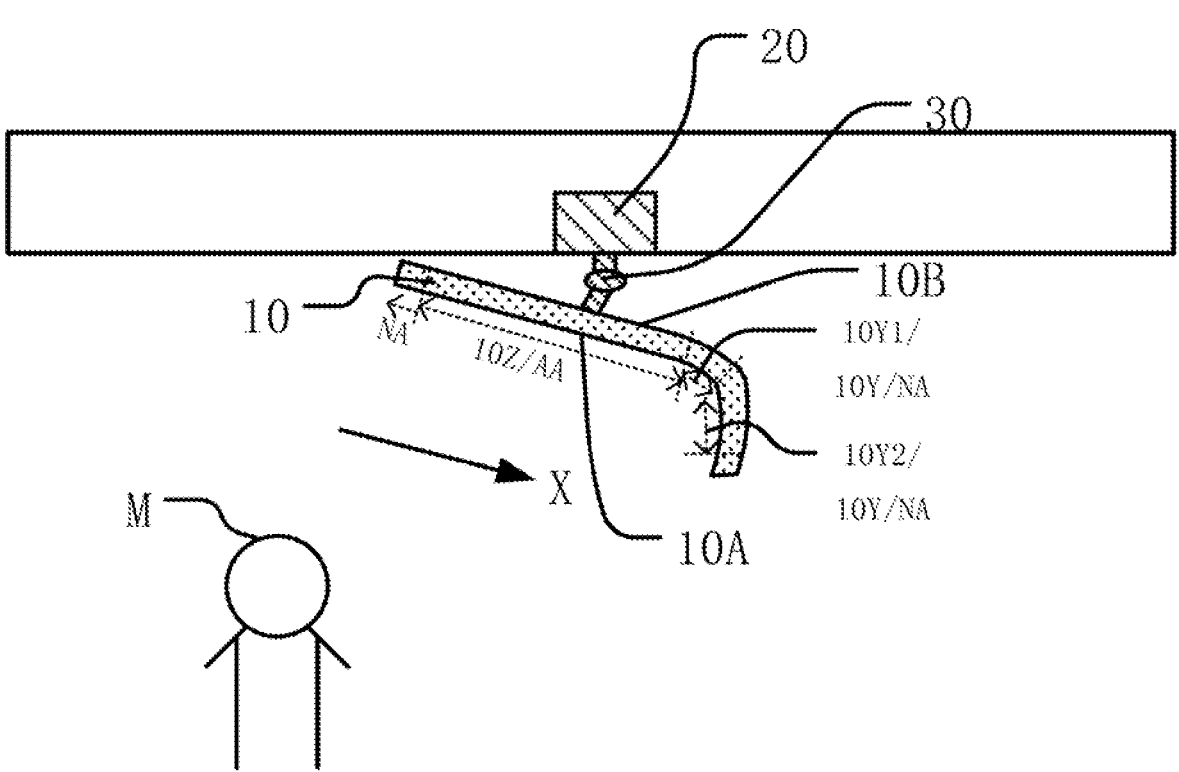
FIG. 29 illustrates another effect diagram of the display device shown in FIG. 8 and FIG. 27 applied to a vehicle-mounted display system.

FIG. 27 is a schematic top view of another exemplary display device according to various disclosed embodiments of the present disclosure. FIG. 28 is an exemplary effect diagram when the display device shown in FIG. 27 is applied to the vehicle-mounted display system. FIG. 29 is another exemplary effect diagram when the display device shown in FIG. 27 is applied to the vehicle-mounted display system (the display devices schematically shown in FIG. 28 and FIG. 29 may also be understood as the top side view of the display device in FIG. 27). As shown in FIGS. 27-29, in some embodiments, in the first direction X, the flexible display module 10 may include a main display region 10Z and an edge region 10Y located on at least one side of the main display region 10Z. The first direction X and the extension direction of the central axis around which the hinge component 1011 is bent (that is, the second direction Y shown in the figure) may intersect or may be perpendicular to each other.

Under the control of the hinge component 1011, the curvature of the flexible display module 10 in at least one edge region 10Y may be greater than or equal to the curvature of the flexible display module 10 in the main display region 10Z.

This embodiment explains that the display device 000 may bend the supporting backplate 101 under the control of the hinge component 1011, and then drive the curvature of the flexible display module 10 of at least one edge region 10Y of the entire flexible display module 10 to be greater than or equal to the curvature of the flexible display module 10 in the main display region 10Z. The main display region 10Z and the edge region 10Y of the flexible display module 10 may be arranged in the first direction X, and the edge region 10Y may be located on at least one side of the main display region 10Z. When the illustrated display device is applied to the central control panel area of the vehicle-mounted display system, the hinge component 1011 may be used to control the curvature of the flexible display module 10 on at least one side of the edge region 10Y in the first direction X to be equal to the curvature of the flexible display module 10 in the main display region 10Z (as shown in FIG. 28), for example, the curvature of the edge region 10Y may be same as the curvature of the main display region 10Z. At this time, the edge region 10Y of the flexible display module 10 of the display device 000 may not block the ambient light.

In one embodiment, the display device 000 may include a display region AA and a non-display region NA around the display region AA. At this time, the edge region 10Y may also be displayed, for example, the edge region 10Y may be used as the display region AA. When the edge region 10Y does not block the ambient light, it may be used together with the main display region 10Z as the display region AA of the flexible display module 10, which may be beneficial to expand the display area of the display device 000. In some embodiments, as shown in FIG. 27 and FIG. 29, through the control of the hinge component 1011, the curvature of the flexible display module 10 in the edge region 10Y on at least one side of the first direction X may be larger than that of the flexible display module 10 in the main display region 10Z (as shown in FIG. 29), for example, the degree of bending of the edge region 10Y may be relatively large, may play a role in blocking ambient light, and may also protect privacy after the flexible display module 10 in the edge region 10Y is bent. In other embodiments, the display device 000 may include a display region AA and a non-display region NA arranged around the display region AA, and the edge region 10Y may be located in the non-display region NA. In this case, the edge region 10Y may be the non-display region NA of the flexible display module 10 and may prevent the edge region 10Y with a large degree of bending from affecting the display effect.

In another embodiment, as shown in FIG. 27 and FIG. 29, the edge region 10Y may include a bending region 10Y1 and a light-shielding region 10Y2 located on the side of the bending region 10Y1 away from the main display region 10Z. The light-shielding region 10Y2 may be located on the side of the light-exiting surface of the main display region 10Z. When the hinge component 1011 drives the flexible display module 10 to bend in the bending region 10Y1, the light-shielding region 10Y2 may be bent to the side of the light-exiting surface of the main display region 10Z through the bending region 10Y1. In one embodiment, the angle between the flexible display module 10 in the main display area 10Z and the flexible display module 10 in the light-shielding region 10Y2 after bending may be in a range of approximately 80°-100°, and the light-shielding region 10Y2 may block the light in the large viewing angle range of the main display region 10Z. Thus, the perspective of people in other positions and the interference of ambient light may be better blocked, and the light-shielding region 10Y2 may play a better role in blocking ambient light and protecting privacy.

It can be understood that the flexible display module 10 within the range of the edge region 10Y in this embodiment may be used as a display area in one case and may be used as a non-display area in another case. The specific control method of the edge region 10Y will not be described in detail. The structure of the flexible display module 10 may include sub-pixels capable of displaying and emitting light under the drive of the driving signal. When the flexible display module 10 within the range of the edge region 10Y is used as a display area, the sub-pixels may be normally driven to emit light. When the flexible display module 10 within the edge region 10Y is used as a non-display area, the sub-pixels within this area may not be provided with driving signals, and the sub-pixels within the edge region 10Y may be used as virtual sub-pixels to realize the flexible display module 10 in the edge region 10Y does not display a picture, and may only play the role of shielding and protecting privacy from the ambient light, and may also be beneficial to reduce the power consumption of the display module 10.

Figure 30:
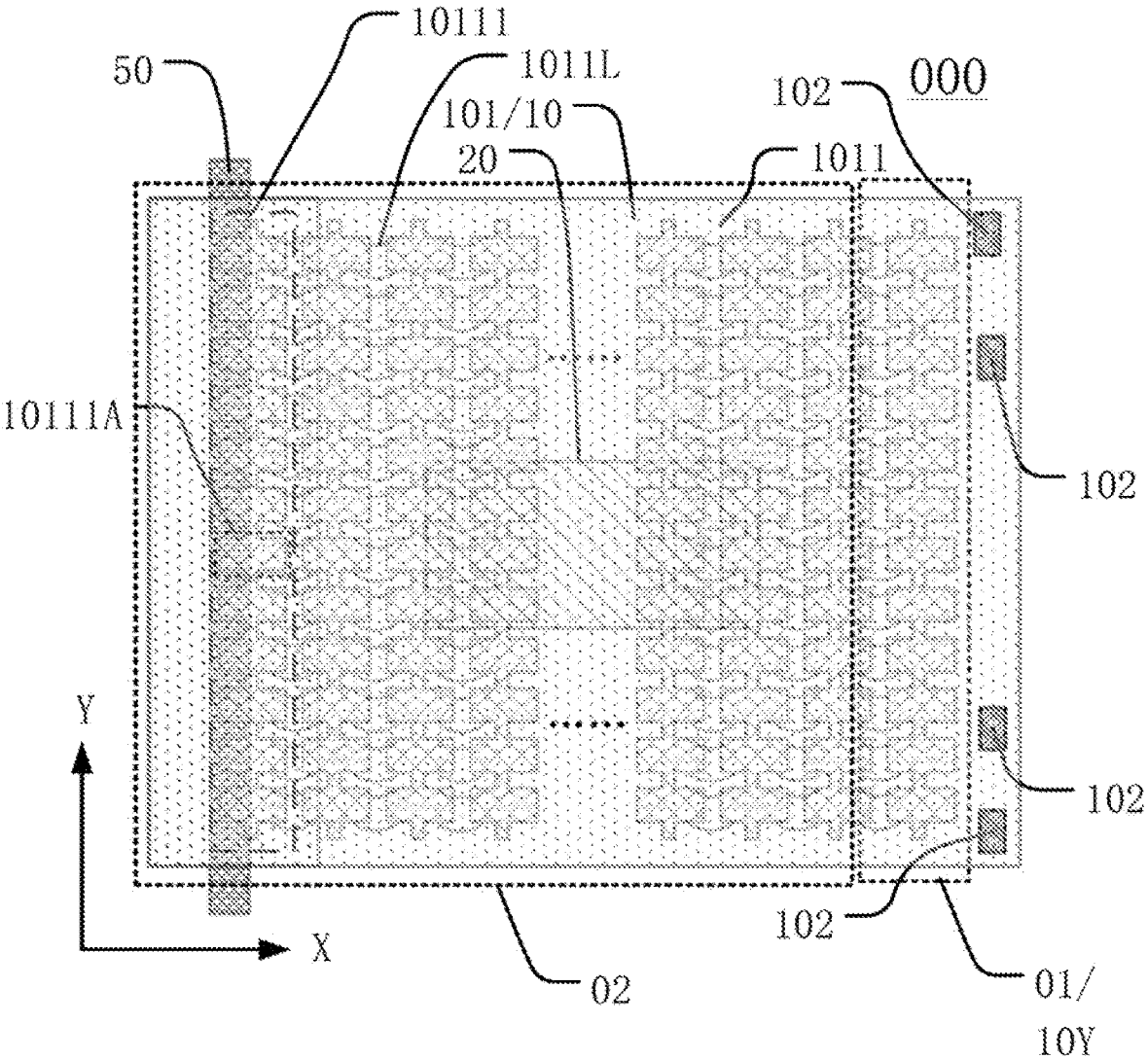
FIG. 30 illustrates another top view of an exemplary display device according to various disclosed embodiments of the present disclosure.
Figure 31:
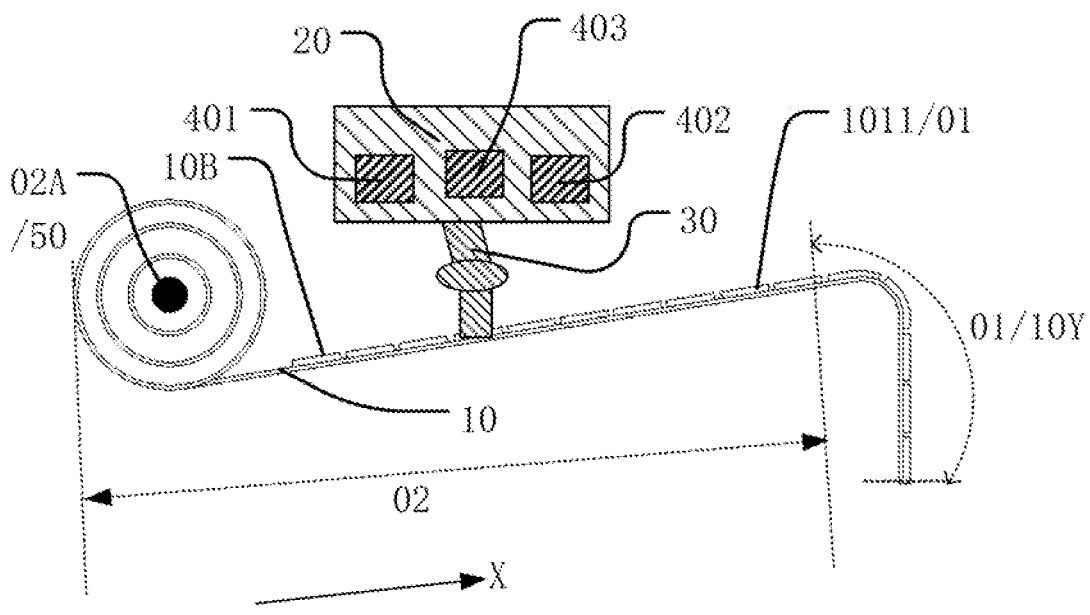
FIG. 31 is a schematic side view of the display device in FIG. 30 from top.
Figure 32:
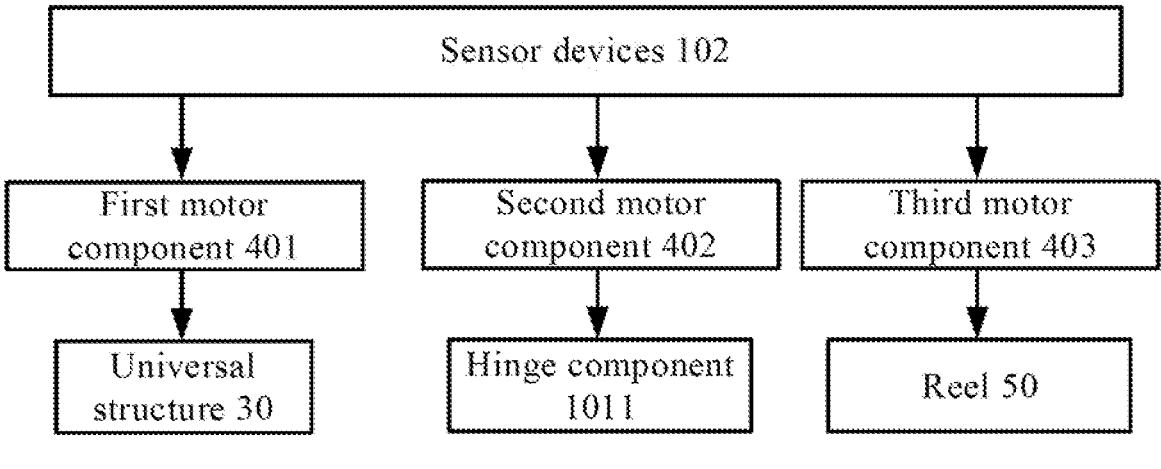
FIG. 32 is a schematic diagram of an electrical connection structure between the sensor device and the universal structure, hinge component, and reel respectively in FIG. 31.
Figure 33:
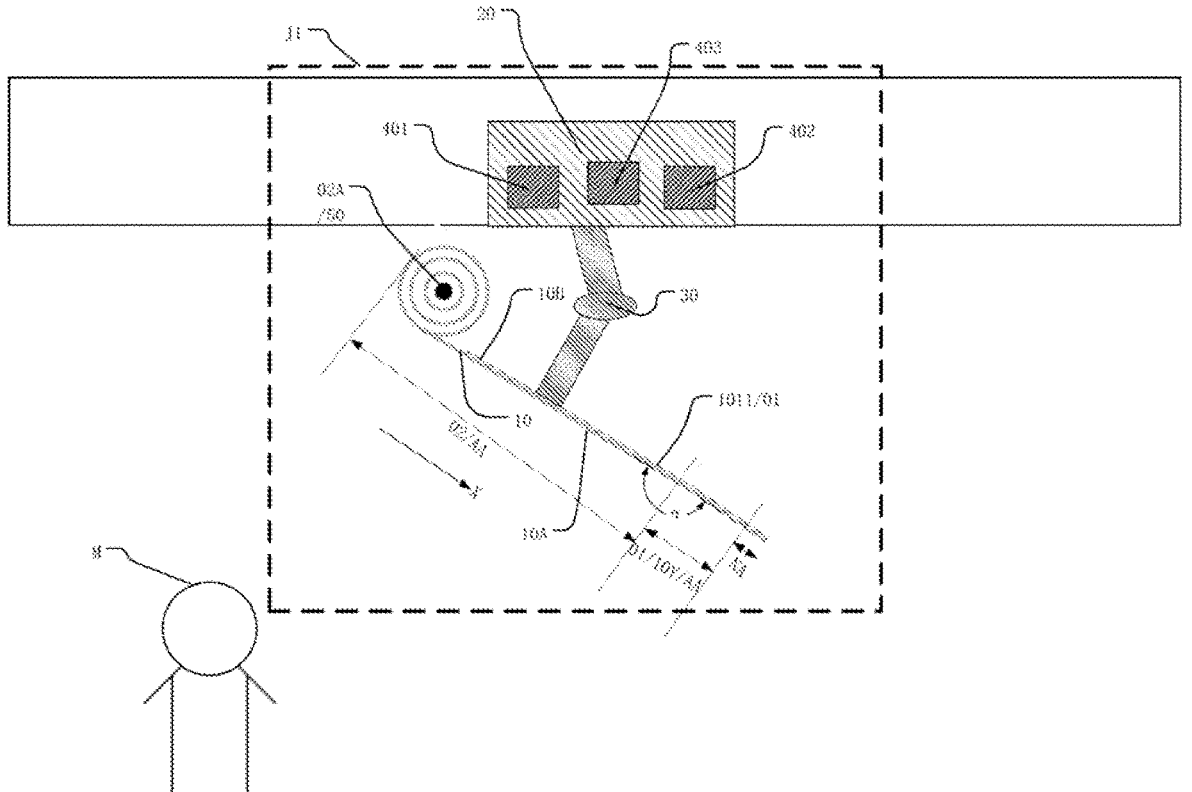
FIG. 33 illustrates an effect diagram of the display device shown in FIG. 31 and FIG. 32 applied to a vehicle-mounted display system.
Figure 34:
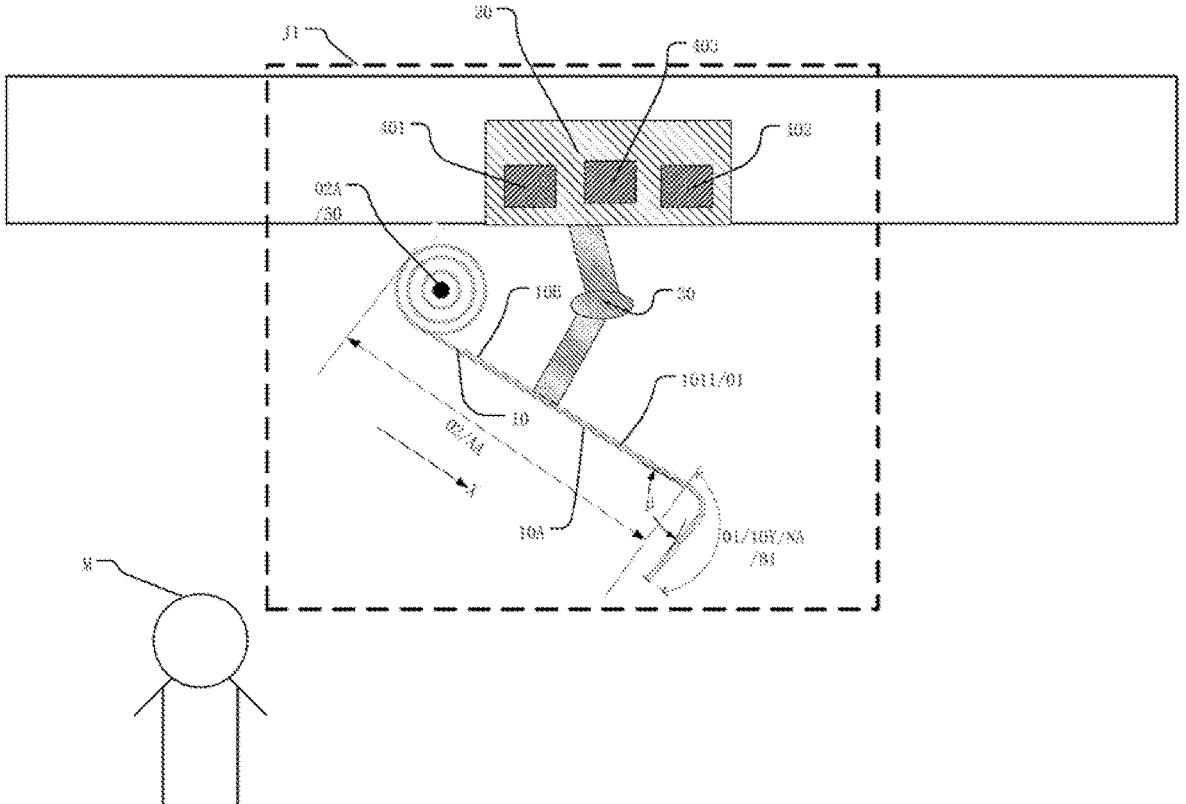
FIG. 34 illustrates another effect diagram of the display device shown in FIG. 31 and FIG. 32 applied to a vehicle-mounted display system.

FIG. 30 is a schematic diagram of a top view of another exemplary display device according to various disclosed embodiments of the present disclosure. FIG. 31 is a side view of the display device in FIG. 30 from top. FIG. 32 is a schematic diagram of the electrical connection structure of the sensor device in FIG. 31 with the universal structure, the hinge component, and the reel. FIG. 33 is an exemplary effect diagram of the display device shown in FIG. 31 and FIG. 32 applied to the vehicle-mounted display system. FIG. 34 is another exemplary effect diagram of the display device shown in FIG. 31 and FIG. 32 applied to the vehicle-mounted display system (the display device illustrated in FIG. 33 and FIG. 34 may also be understood as the top side view of the display device in FIG. 30). As shown in FIGS. 30-34, in one embodiment, the display device 000 may also include a reel 50. Along the first direction X, the display device 000 may include an extensible portion 01 and a non-extensible portion 02 arranged adjacently. The extensible portion 01 may be located in the edge region 10Y. The non-extensible portion 02 may include a winding end 02A, and the winding end 02A may be located on the side of the non-extensible portion 02 away from the extensible portion 01. The winding end 02A may be fixed on the reel 50, and at least a portion of the non-extensible portion 02 may be wound on the reel 50.

The reel 50 may electrically connected to the third motor component 403, and the third motor component 403 may be electrically connected to at least one sensor device 102. In one embodiment, the third motor component 403 may be installed on the side of the backlight surface 10B of the flexible display module 10 (not shown in the drawings), or the third motor component 403 may also be installed on the end of the reel 50 (not shown in the drawings), or the third motor component 403 may also be installed inside the bracket 20 (as shown in FIG. 31) to avoid affecting the light-exiting effect of the display device 000, and may only need to meet the requirement that the third motor component 403 is electrically connected to the sensor device 102 and the reel 50, respectively.

This embodiment explains that the flexible display module 10 included in the display device 000 may be a roll-up screen. Specifically, the display device 000 may include a reel 50, and the display device 000 may include an extensible portion 01 and a non-extensible portion 02 in a first direction X. The first direction X may be understood as a direction perpendicular to the extension direction of the central axis around which the hinge component 1011 is bent (i.e., the second direction Y shown in the figure). The extensible portion 01 may be located in the edge region 10Y of the flexible display module 10. The non-extensible portion 02 may be understood as the area away from the edge region 10Y in the first direction X. The winding end 02A of the non-extensible portion 02 may be located on the side of the non-extensible portion 02 away from the extensible portion 01, and may be fixed on the reel 50. The winding end 02A of the non-extensible portion 02 may be fixed on the reel 50 such that at least a portion of the non-extensible portion 02 may be wound on the reel 50, and the rotation of the reel 50 may change the winding of the non-extensible portion 02 on the reel 50, and then control the extensible portion 01 of the display device 000 to protrude, and through the bending fit of the hinge component 1011, when the ambient light sensed by the sensor device 102 is not high, the hinge component 1011 may control the extensible portion 01 and non-extensible portion 02 to bend or not to bend to a small degree, and the space between extensible portion 01 and non-extensible portion 02 may still be a flat or similar flat structure (as shown in FIG. 33). Both the extensible portion 01 and the non-extensible portion part 02 of the edge region 10Y may be used as a display area. In one embodiment, as shown in FIGS. 30-33, the display device 000 may include the first state at this time. At the first state, both the extensible portion 01 and the non-extensible portion 02 may serve as the display region AA of the display device 000, which may be beneficial to enlarge the display area of the display device 000. Further, the ambient light brightness sensed by the sensor device 102 is relatively high, the hinge component 1011 may control the junction of the extensible portion 01 and the non-extensible portion 02 to bend, and the extensible portion 01 and the non-extensible portion 02 may form an angle (as shown in the FIG. 34), and the extensible portion 01 may also form a cap-like shielding structure in the edge region 10Y to block ambient light and protect privacy. In another embodiment, as shown in FIGS. 30-32 and FIG. 34, the display device 000 may include a second state. At the second state, the non-extensible portion 02 may be used as the display region AA of the display device 000, the extensible portion 01 may be used as the non-display region NA of the display device 000, and the extensible portion 01 located in the edge region 10Y may be used as a non-display area.

It should be noted that, when the flexible display module 10 in this embodiment is a roll-up screen including a reel 50, the extensible range of the extensible part 01 may be controlled by controlling the number of turns of the non-extensible portion 02 on the reel 50. When the user does not need to protect privacy or does not need to block the ambient light, the number of coils wound on the reel 50 may be more, and the extensible portion 01 may not be stretched out or bent; and when the user needs to protect privacy, block light with a large viewing angle or the ambient light, more non-extensible portions 02 may be released from the reel 50 by reducing the number of turns on the reel 50, and the extensible portion 01 may extend out to a larger range and may be controlled to bend through the hinge component 1011 to block the light with a large viewing angle on the light-exiting surface of the flexible display module 10 and to block ambient light. After changing from the state where the extensible portion 01 is not stretched out to the state where the extensible part 01 is stretched out to act as a shield, the area of the display area of the flexible display module 10 may be understood as not changing before and after the transition, only the position of the display area in the flexible display module 10 is changed, for example, the more the extensible portion 01 protrudes, the more the position of the display area on the flexible display module 10 moves closer to the winding end 02A of the non-extensible portion 02.

It can be understood that when the display device 000 of this embodiment is applied to the central control panel area J1 in the vehicle-mounted display system, as shown in FIG. 34, the extensible portion 01 may form a curved brim-like shielding structure on the side away from the driver M (i.e., the right side of the central control region J1), which may shield the ambient light of the non-driving position, and shield the sight of other people except the driver. Accordingly, the privacy of the driver M, that is, the user, may be protected.

Figure 35:
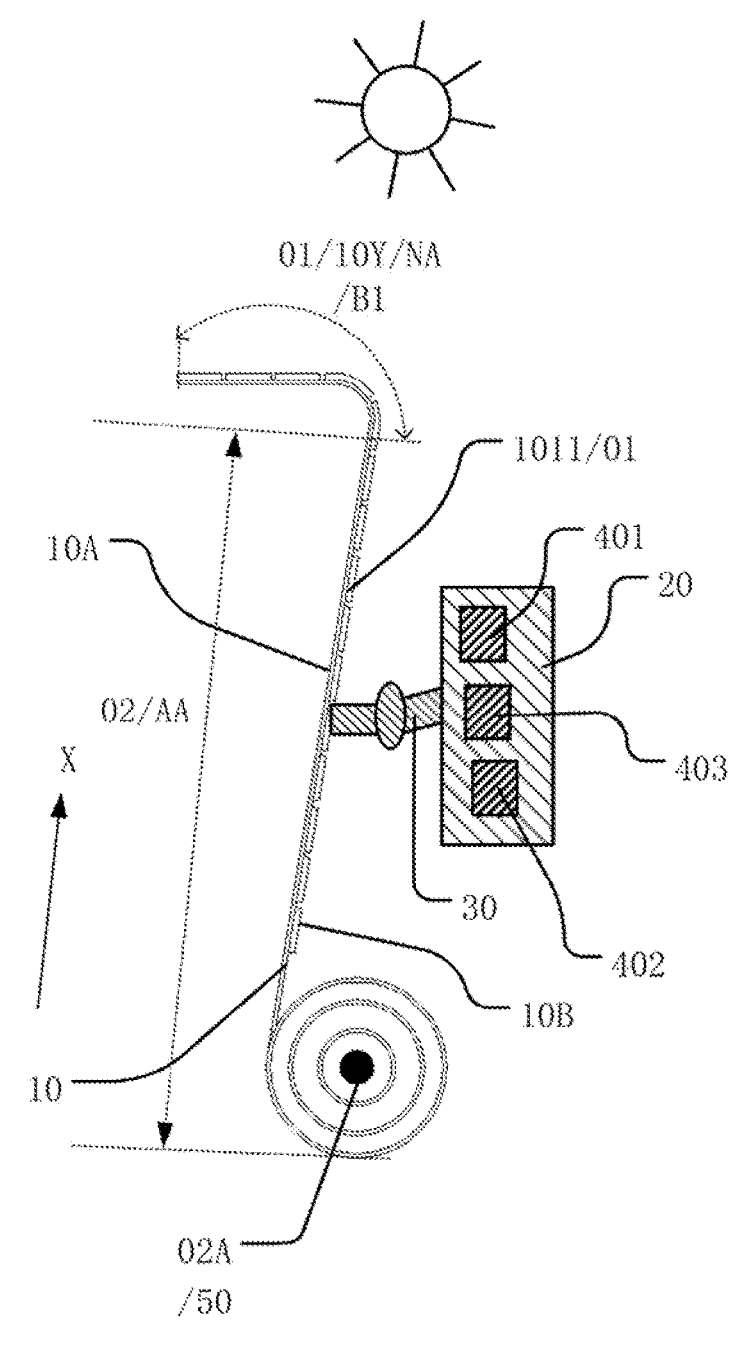
FIG. 35 illustrates another effect diagram of the display device shown in FIG. 31 and FIG. 32 applied to a vehicle-mounted display system.

FIG. 35 is another exemplary effect diagram of the display device shown in FIG. 31 and FIG. 32 applied to a vehicle-mounted display system. FIG. 35 may be understood as a side view of the flexible display module 10 obtained after being rotated counterclockwise in the figure through the universal structure 30, such that the extensible portion 01 may be rotated to the top of the central control screen area to block the ambient light passing through the windshield. Specifically, when the display device 000 is applied to the central control panel area of the vehicle-mounted display system, the steering of the universal structure 30 may be changed through the first motor component 401 such that the bent extensible portion 01 may be rotated to the top of the central control panel area J1 (It can be understood as turning the flexible display module 10 in FIG. 34 through the universal structure 30 such that the extensible portion 01 may be rotated to the top of the central control screen area J1), and the side where the reel 50 is located may be rotated to the bottom of the central control screen area J1. As shown in FIG. 35, the ambient light (sunlight as shown in FIG. 35) may be blocked by the top of the central control screen area J1, when the driver M views the flexible display module 10 and when the external light is too strong, the display contrast and the display quality may be improved.

Figure 36:
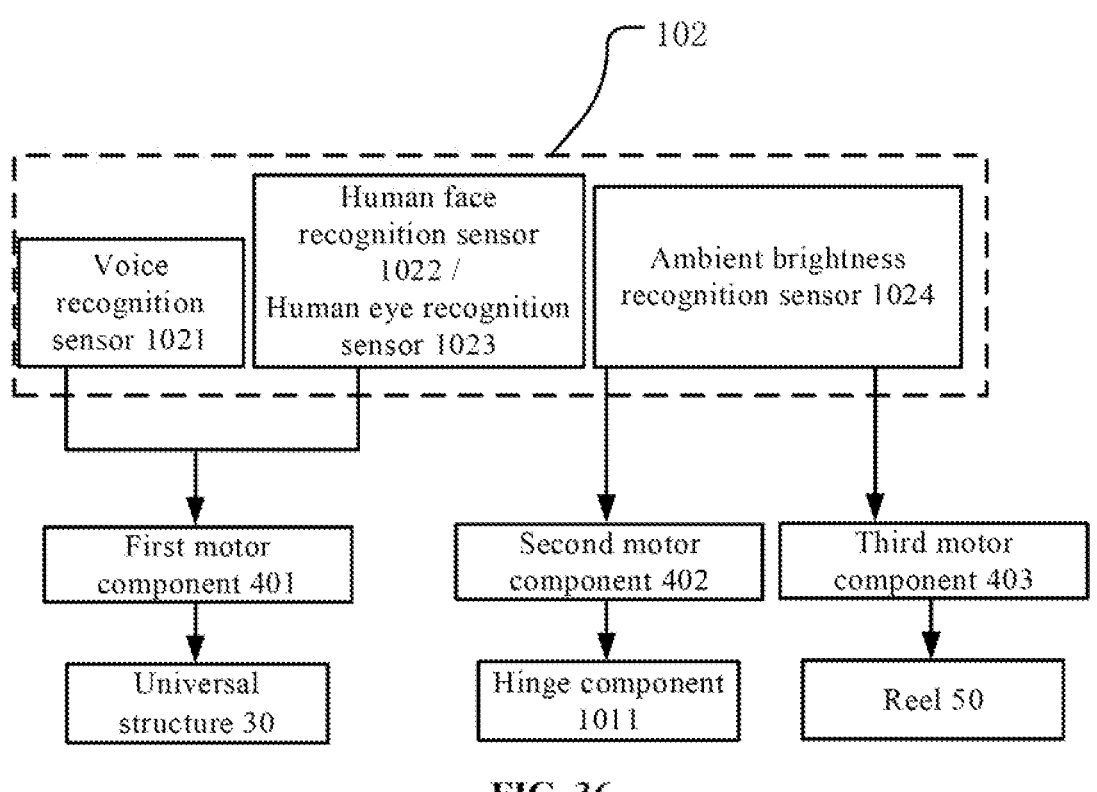
FIG. 36 is a schematic diagram of another electrical connection structure between the sensor device and the universal structure, hinge component, and reel respectively in FIG. 31.

FIG. 36 is a schematic diagram of another electrical connection structure between the sensor device, and the universal structure, the hinge component and the reel in FIG. 31. As shown in FIG. 36, the plurality of sensor devices 102 may include the voice recognition sensor 1021, a voice recognition sensor 1022 or a human eye recognition sensor 1023. The voice recognition sensor 1021, the face recognition sensor 1022 or the human eye recognition sensor 1023 may be electrically connected to the universal structure 30 through the first motor component 401. The plurality of sensor devices 102 may also include an ambient brightness recognition sensor 1024 electrically connected to the hinge component 1011 through the second motor component 402. The third motor component 403 electrically connected to the reel 50 in this embodiment may be a rotating motor, and the rotating motor may also be electrically connected to the ambient brightness recognition sensor 1024. The ambient brightness recognition sensor 1024 may recognize that the ambient light brightness is lower than a first threshold (it can be understood that the first threshold may be the preset ambient light brightness value of the display device 000, when the measured ambient light brightness is higher than the first threshold, it may cause the problem that the display contrast is too low to affect the viewing effect), the rotating motor may control the number of turns of the non-extensible portion 02 wound by the reel 50 to be more, and may cooperate with the hinge component 1011 to control the supporting backplate 101 to be flat or similar. When the ambient light brightness measured by the ambient brightness recognition sensor 1024 is lower than the preset first threshold, the display contrast and viewing effect will not be affected. At this time, the hinge component 1011 may not be operated, and there may be no need for the hinge component 1011 to control the curvature of the surface of the supporting backplane 101 to be changed at the position of the junction of the extensible portion 01 and the non-extensible portion 02, and the surface may be kept as planar in the original state or similar to planar. When the ambient brightness recognition sensor 1024 recognizes that the ambient light brightness is higher than the first threshold, the rotating motor may control the number of turns of the non-extended part 02 wound by the reel 50 to be less such that more non-extensible parts 02 may be stretched out from the reel 50, while the hinge component 1011 may control the curvature of the surface of the support backplate 101 at the junction of the extensible portion 01 and the non-extensible portion 02 to be changed, for example, when the ambient light brightness actually measured by the ambient brightness recognition sensor 1024 is higher than the preset first threshold, there may be an issue that the display contrast may be too low to affect the viewing effect, the hinge component 1011 may be used to control the bending of the junction of the extensible portion 01 and the non-extensible portion 02 such that that the supporting backplate 101 may drive the flexible display module 10 to be bent at the junction position between the extensible portion 01 and the non-extensible portion 02, and more non-extensible portion 02 may be stretched out by the rotation of the reel 50 for display. Further, the bent extensible portion 02 may play a role in blocking ambient light. By improving the display contrast, the viewers may get better viewing effects, and a privacy protection may be realized.

In one embodiment, as shown in FIG. 33, when the ambient light sensed by the sensor device 102 is not high, the hinge component 1011 may control to cause the junction of the extensible portion 01 and the non-extensible portion 02 not to bend or bend with a small degree, and the extensible portion 01 and the non-extensible portion 02 may still be a flat or similar flat structure, which may make the display device 000 at the first state. The angle formed between the extensible portion 01 and the non-extensible portion 02 by the controlling of the hinge component 1011 may be α, and $150° \leq \alpha \leq 180°$. Accordingly, both the extensible portion 01 and the non-extensible portion 02 may be used as the display region AA of the display device 000 at the first state, which may be beneficial to expand the display area of the display device 000.

In another embodiment, as shown in FIG. 34, when the ambient light sensed by the sensor device 102 is relatively high, the hinge component 1011 may control the junction of the extensible portion 01 and the non-extensible portion 02 to have a larger bending; and the extensible portion 01 may form an angle with the non-extensible portion 02, and the display device may be at a second state. When the display device 000 is at the second state, the angle formed between the extensible portion 01 and the non-extensible portion 02 by the controlling of the hinge component 1011 may be β, and $80° \leq \beta \leq 100°$. Such a configuration may mean that, in the second state, the extensible portion 01 may form a cap-like shielding structure in the edge region 10Y that may block ambient light and protect privacy.

Figure 37:
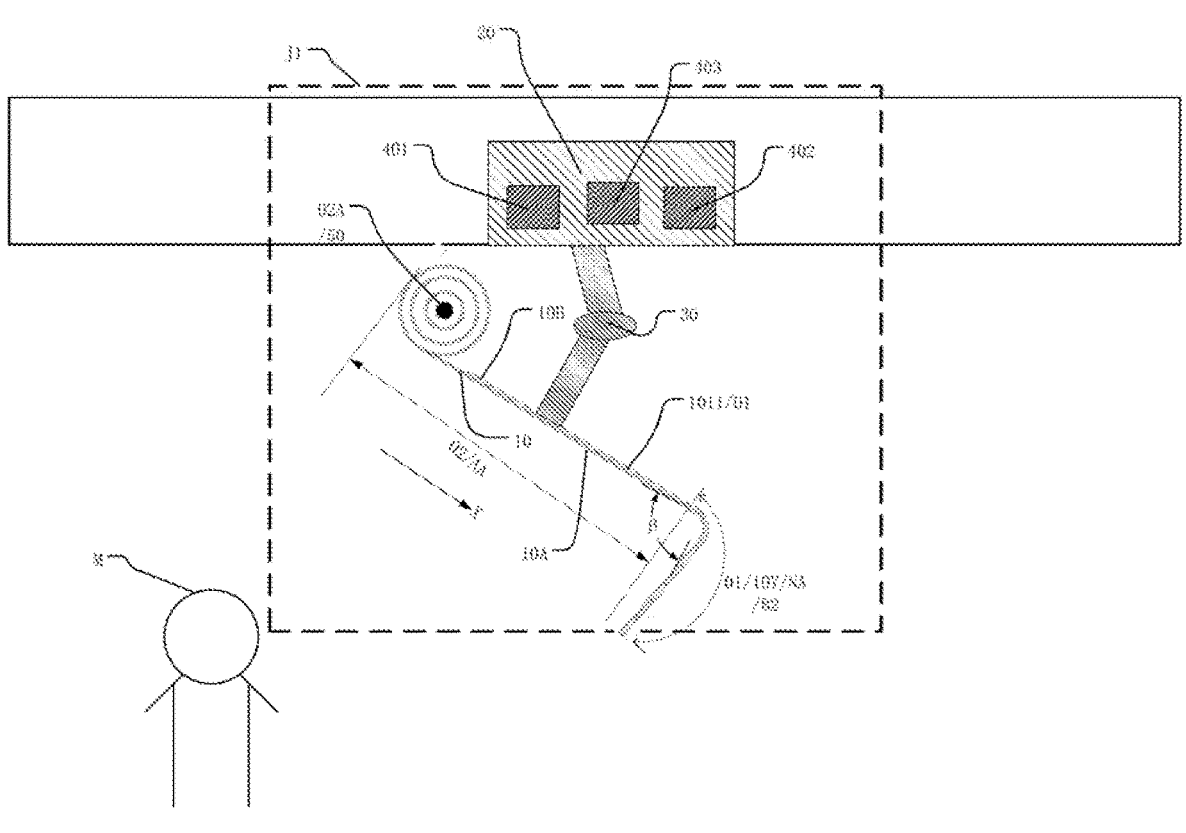
FIG. 37 illustrates another effect diagram of the display device shown in FIG. 31 and FIG. 32 applied to a vehicle-mounted display system.

FIG. 37 is another exemplary effect diagram of the display device shown in FIG. 31 and FIG. 32 applied to a vehicle-mounted display system (it can be understood that, to clearly illustrate the structure of this embodiment, the display device shown in FIG. 37 can also be understood as the top side view of the display device in FIG. 30). As shown in FIGS. 30-37, in one embodiment, the display device 000 may be in the second state. As shown in FIG. 34, the ambient light brightness sensed by the ambient brightness recognition sensor 1024 may be A1, and the width of the extensible portion 01 may be B1. As shown in FIG. 27, the ambient light brightness sensed by the ambient brightness recognition sensor 1024 may be A2, and the width of the extensible portion 01 may be B2, A2>A1, and B2>B1.

This embodiment explains that the width of the extensible portion 01 located in the edge region 10Y may be changed by following the change of ambient light brightness. When the ambient light brightness measured by the ambient brightness recognition sensor 1024 is higher than the preset first threshold, it may cause an issue that, when the display contrast is too low, the viewing effect may be affected. When the ambient light brightness sensed by the ambient brightness recognition sensor 1024 is A1, then the corresponding third motor component 403 may control the number of turns of the non-extensible portion 02 wound on the reel 50 to be relatively more such that the width of the extensible portion 01 that blocks the ambient light may be B1. If the ambient light brightness sensed by the ambient brightness recognition sensor 1024 is A2, and A2>A1. When the ambient light brightness is stronger, the corresponding third motor component 403 may control the number of turns of the non-extensible portion 02 wound on the reel 50 to be less such that more portion of the non-extensible portion 02 wind out of the reel 50. Accordingly, the area of the extensible portion 01 at one end of the non-extensible portion 02 may be stretched out more, that is, the width of the extension part 01 may be B2, and B2>B1. Accordingly, the stronger the ambient light brightness sensed by the ambient brightness recognition sensor 1024, the wider the width of the extension portion 01 that acts as a shield. Thus, more light from the large viewing angle range of the light-exiting surface of the flexible display module 10 of the non-extending portion 02 may be blocked, and the viewing angles of people in other positions and the interference of ambient light may be blocked more. Accordingly, the functions of shielding the ambient light and protecting the privacy may be realized better.

Figure 38:
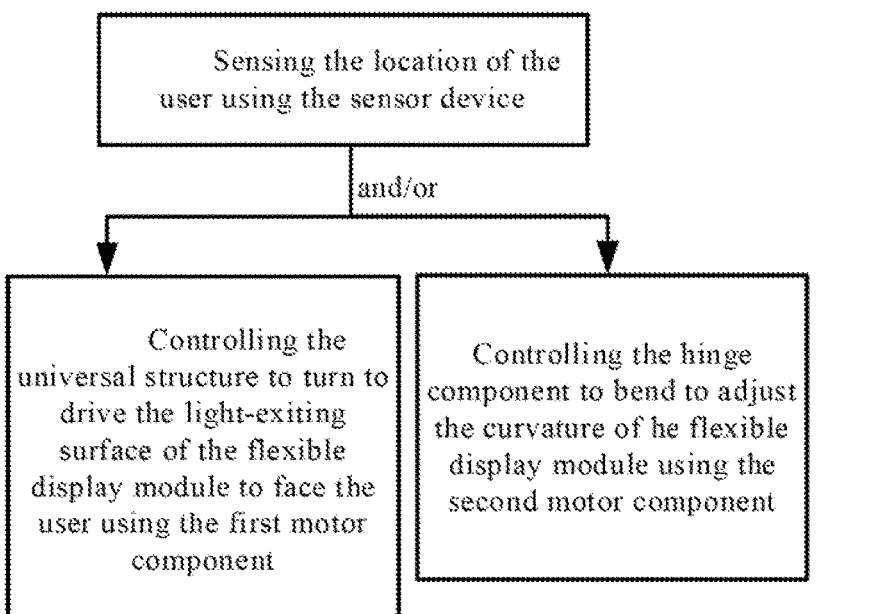
FIG. 38 illustrates a flowchart of an exemplary control method of a display device according to various disclosed embodiments of the present disclosure.

The present disclosure also provides a method for controlling a display device. FIG. 38 is a flowchart of an exemplary method for controlling a display device according to various disclosed embodiments of the present disclosure. The display device may be the display device 000 described above. As shown in FIG. 38 and referring to FIGS. 1-10, the control method may includes:

sensing the user's location using a plurality of sensor devices;

controlling the universal structure to turn such that the light-emitting surface of the flexible display module may face the user using the first motor component; and/or controlling the to bend using the hinge component to adjust the curvature of the flexible display module using the second motor component.

This embodiment explains that the control method of the display device may be used to control the display device shown in FIG. 1, FIG. 2, and FIG. 3. The sensor devices 102 may sense the position of the user, the first motor component 401 may control the universal structure 30 to turn to cause the light-exiting surface 10A of the flexible display module 10 to face the user. The feedback information sensed by the sensor devices 102, such as the user's position feedback, and/or sound feedback, etc., may be transmitted to the first motor component 401. After the first motor component 401 transmits the kinetic energy to the universal structure 30 through calculation, the direction of the universal structure 30 may be changed. Accordingly, by controlling the universal structure 30 through the first motor component 401, the direction of the supporting backplate 101 may be controlled the flexible display module 10 to turn such that the light-exiting surface 10A of the flexible display module 10 may face the user as much as possible to achieve a better viewing angle for the user. When the display device 000 is applied to the central control panel area of the vehicle-mounted display system, even if the display device 000 is far away from the driver's position, the light-emitting surface 10A of the flexible display module 10 may be controlled to face the driver by the first motor component 401 and the universal structure 30 in time according to the driver's position. Accordingly, the driver may watch the display screen of the light-exiting surface 10A of the flexible display module 10 without turning his head when performing a human-vehicle interaction, and may perform screen operations when necessary. During the driving process of the vehicle, the driver's sight may be prevented from leaving the driving direction, which may be conducive to improving driving safety.

This embodiment explains that the control method of the display device may also be used to control the display device shown in FIG. 4, FIG. 5 and FIG. 6 above. The sensor devices 102 may sense the position of the user, and the second motor component 402 may control the hinge component 1011 to bend to adjust the curvature of the flexible display module 10. The feedback information sensed by the sensor device 102, such as the user's position feedback, and sound feedback, etc., may be transmitted to the second motor component 402. After the second motor component 402 transmits the kinetic energy to the hinge component 1011 through a calculation, the degree of bending of the hinge component 1011 may be changed, such as being changed from a flat surface to a curved surface, or from a curved surface with a smaller curvature to a curved surface with a larger curvature. The hinge component 1011 may be controlled through the second motor component 402, and then the degree of the curvature of the supporting backplate 101 may be changed to change the degree of curvature of the flexible display module 10. By configuring the light-exiting surface 10A of the flexible display module to be a curved surface, the light-exiting surface 10A of the flexible display module may face the user as much as possible to achieve a better viewing angle for the user. When the display device 000 is applied to the central control panel area of the vehicle-mounted display system, even if the display device 000 is far away from the driver's position, the light-exiting surface 10A of the flexible display module 10 may be curved and may face the driver through the controlling of the second motor component 402 and the hinge component 1011 in time according to the driver's position. Accordingly, the driver may watch the display screen of the light-exiting surface 10A of the flexible display module 10 without turning his head during the human-vehicle interaction and adjust it when necessary. Further, the driver's sight may be prevented from leaving the driving direction during vehicle driving, which may be conducive to improving driving safety.

This embodiment explains that the control method of the display device may also be used to control the display device shown in FIG. 7, FIG. 8 and FIG. 9 above. The sensor devices 102 may sense the position of the user, and the first motor component 401 may control the universal structure 30 to turn to drive the light-exiting surface 10A of the flexible display module 10 to face the user. At the same time, the second motor component 402 may control the bending of the hinge component 1011 to adjust the curvature of the flexible display module 10, and the feedback information sensed by the sensor device 102, such as the user position feedback, and/or sound feedback and other information of the operator may be transmitted to the first motor component 401. The first motor component 401 may transmit the kinetic energy to the universal structure 30 through calculation such that the universal structure 30 changes the steering direction. By controlling the universal structure 30 through the first motor component 401, the turning of the supporting backplate 101 may be changed to change the direction of the flexible display module 10. At the same time, the feedback information sensed by the sensor device 102, such as the user's position feedback, and/or sound feedback, etc., may be transmitted to the second motor component 402. After the second motor component 402 transfers the kinetic energy to the hinge component 1011 through calculation, the hinge component 1011 may change the degree of bending, such as changing from a flat shape to a curved shape, or from a curved shape with a smaller curvature to a curved shape with a larger curvature, to control the hinge component 1011 through the second motor component 402, and to further control the bending degree of the supporting backplate 101 when the direction of the light-exiting surface 10A of the flexible display module 10 is changed. By setting the light-exiting surface 10A of the flexible display module 10 as a curved surface, the light-exiting surface 10A of the flexible display module 10 may face the user further to achieve a better viewing angle for the user. When the display device 000 is applied to the central control panel area of the vehicle-mounted display system, even if the display device 000 is far away from the driver's position, the light-exiting surface 10A of the flexible display module 10 may be controlled toward the driver at a better angle through the control of the first motor component 401, the universal structure 30, the second motor component 402 and the hinge component 1011 in time according to the driver's position, which may be conducive to further improving driving safety, and may also block the surrounding area within the viewing range of the user. Further, it may facilitate to improve the contrast when the user watches the display device 000, and may further help the user to achieve the best viewing effect as possible.

Figure 39:
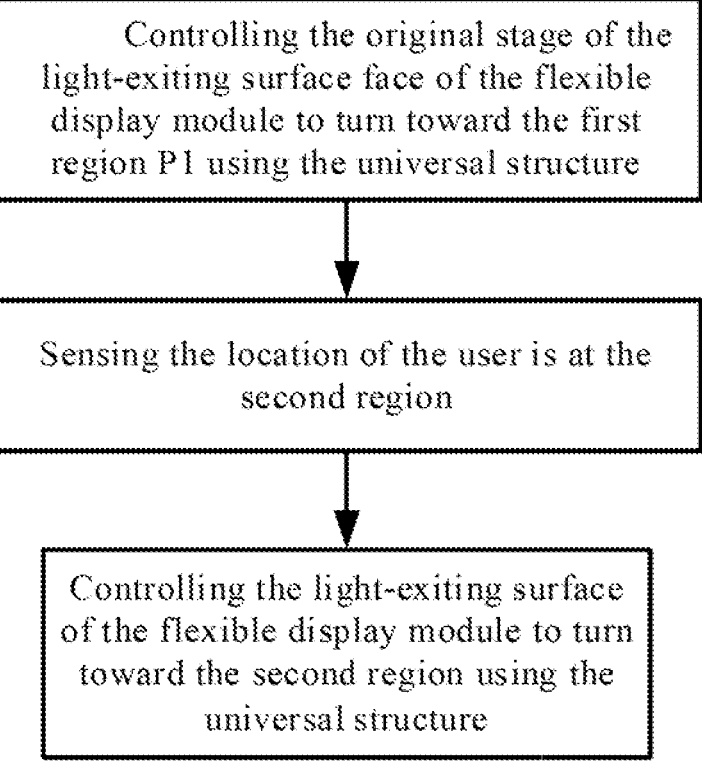
FIG. 39 illustrates another flowchart of an exemplary control method of a display device according to various disclosed embodiments of the present disclosure.

FIG. 39 is another flowchart of an exemplary control method of a display device according to various disclosed embodiments of the present disclosure. As shown in FIG. 39 and referring to FIGS. 1-4 and FIGS. 11-12, in one embodiment, in the control method, the sensor devices 102 may sense the position of the user, the first motor component 401 may control the rotation of the universal structure 30, and the light-exiting surface 10A of the flexible display module 10 may be controlled to face the user. Specifically, the universal structure 30 may control the original state of the light-exiting surface 10A of the flexible display module 10 to turn to the first region P1, and after the sensor devices 102 detect that the user's position is in the second region P2, the universal structure 30 may control the light-exiting surface 10A of the flexible display module 10 to turn to the second region P2. The positions of the first region P1 and the second region P2 may be different. In one embodiment, the first region P1 may be understood as the original orientation area of the display device 000 in the original state, that is, when the universal structure 30 has not received a rotation instruction. The second region P2 may be understood as the area where the sensor device 102 in the display device 000 senses the position of the user and the universal structure 30 faces after receiving the rotation command.

FIG. 40 is a flowchart of another exemplary control method for a display device according to various disclosed embodiments of the present disclosure. As shown in FIG. 40 and referring to FIGS. 1-4, in one embodiment, the plurality of sensor devices 102 of the display device 000 may include at least a human face recognition sensor 1022 and a voice recognition sensor 1021. The control method for the display device 000 may include the following steps.

The voice recognition sensor 1021 may sense the target region P0 where the user is located, the human face recognition sensor 1022 may be activated in the target region P0 to determine the first position P01 where the user's face is located, and the universal structure 30 may control the light-exiting surface 10A of the flexible display module 10 to turn toward the first position P01.

This embodiment explains the specific process of the sensor devices 102 sensing the user's location in the control method of the display device. The plurality of sensor devices 102 included in the flexible display module 10 may include a voice recognition sensor 1021 and a human face recognition sensor 1022. In the process of controlling the display device 000, when the user needs to perform a human-computer interaction, the target area P0 where the user is located may be identified only through the voice recognition sensor 1021, and the first motor component 401 may control the light-exiting surface 10A of the flexible display module 10 to first turn to the target region P0 through the universal structure 30, which may be beneficial to reduce the power consumption of the display device 000. Then, the human face recognition sensor 1022 or the human eye recognition sensor 1023 may be activated. In the target region P0, the face recognition sensor 102 may recognize the accurate first position P01 where the user is, and the first motor component 401 may control the light-exiting surface 10A of the flexible display module 10 to turn toward the first position P01 through the universal structure 30, which may be beneficial to reduce the power consumption while accurately sensing the first position P01 where the user is located, which may be beneficial to improve the accuracy of screen steering.

FIG. 41 is a flowchart of another exemplary method for controlling a display device according to various disclosed embodiments. As shown in FIG. 41, and referring to FIG. 1, FIGS. 5-7 and FIGS. 13-14, in one embodiment, the control method of the display device 000, the sensor devices 102 may sense the position of the user; the second motor component 402 may control the bending of the hinge component 1011 to adjust the curvature of the flexible display module 10. The process may include following steps.

The hinge component 1011 may control the original state of the supporting backplate 101 to present the first surface 101A, the sensor devices 102 may sense the user's position, and the hinge component 1011 may control the supporting backplate 101 to present the second surface 101B such that the curvature of the second surface 101B may be larger than the curvature of the first surface 101A.

This embodiment explains the specific process of the sensor devices 102 sensing the user's location in the control method of the display device. The hinge component 1011 may control the original state of the supporting backplate 101 to present the first surface 101A, and the first surface 101A may be a flat or curved surface. The sensor devices 102 may sense the position of the user, the hinge component 1011 may control the supporting backplate 101 to present the second surface 101B. The second surface 101B may be a curved surface with a greater degree of curvature than the first surface 101A. The curvatures of the first surface 101A and the second surface 101B may be different, that is, the degrees of curvature may be different. The supporting backplate 101 having the first surface 101A may be understood as the original state of the display device 000 when the hinge component 1011 does not receive a bending instruction, and the supporting backplate 101 having the second surface 101B may be understood as the state of the display device after the sensor devices 102 in the display device 000 senses the position of the user, and the hinge component 1011 bends after receiving the bending instruction to change the state of the curvature. Accordingly, the best screen viewing angle for the user may be achieved after the adjustment of the hinge component 1011, and which may better improve the security of use and display effects.

Further, the plurality of sensor devices 102 of the display device 000 may include an ambient brightness recognition sensor 1024. The ambient brightness recognition sensor 1024 may recognize that the brightness of the ambient light is lower than a first threshold (it can be understood that the first threshold may be the preset value of the display device 000 when the measured ambient light brightness is higher than the first threshold value, and it may cause a problem that the display contrast is too low and affects the viewing effect), the hinge component 1011 may control the supporting backplate 101 to present a first surface 101A, and the first surface 101A may be planar. When the ambient light brightness measured by the ambient brightness recognition sensor 1024 is lower than the preset first threshold, it may not affect the display contrast and viewing effect. At this time, the hinge component 1011 may not need to be operated, and the hinge component 1011 may not need to control the surface of the supporting backplate 101 to change the curvature. When the ambient brightness recognition sensor 1024 recognizes that the ambient light brightness is higher than the first threshold, and the hinge component 1011 may control the supporting backplate 101 to present the second surface 101B, and the second surface 101B may be curved. For example, when the ambient light brightness measured by the brightness recognition sensor 1024 is higher than the preset first threshold, which may cause a problem that the display contrast is too low and affects the viewing effect, the hinge component 1011 may be used to control the surface of the supporting backplate 101 to change the curvature such that the supporting backplate 101 may drive the light-exiting surface 10A of the flexible display module 10 to be curved, and the curved light-exiting surface 10A of the flexible display module 10 may block the ambient light. Accordingly, by improving the display contrast, the viewer may get a better viewing effect.

FIG. 42 is another exemplary effect of the display device shown in FIG. 27 applied to a vehicle-mounted display system. FIG. 43 is a flowchart of another exemplary control method of the display device according to various disclosed embodiments. As shown in FIGS. 42-43, and referring to FIG. 22, FIG. 27 and FIG. 29, in one embodiment, in the control method of the display device, the flexible display module 10 may include a middle region (the middle region may be understood as the main display region 10Z in FIG. 27) and edge regions 10Y located on opposite sides of the middle region Under the control of the hinge component 1011, the curvature of the flexible display module 10 in at least one edge region 10Y may include at least a first gear position (as shown in FIG. 29) and a second gear position (as shown in FIG. 42), the curvature of the flexible display module 10 in the lower edge region 10Y under the first gear position may be greater than the curvature of the flexible display module 10 in the edge region 10Y under the second gear position.

The sensor devices 102 may include at least an ambient brightness recognition sensor 1024. If the ambient light brightness sensed by the ambient brightness recognition sensor 1024 is C1, the hinge component 1011 may control the curvature of the flexible display module 10 in the edge region 10Y to be at the first gear position. When the ambient light brightness sensed by the ambient brightness recognition sensor 1024 is C2, the hinge component 1011 may control the curvature of the flexible display module 10 in the edge region 10Y to be at the second gear position. C1>C2.

This embodiment explains that in the control method of the display device, the bending curvature of the edge region 10Y of the flexible display module 10 may be set by following the change of the ambient light brightness. For example, under the control of the hinge component 1011, the curvature of the flexible display module 10 in at least one edge region 10Y may include at least two different gear positions: the first gear position and the second gear position. Specifically, if the ambient brightness sensed by the ambient brightness recognition sensor 1024 is C1, the hinge component 1011 may control the curvature of the flexible display module 10 in the edge area 10Y to be at the first gear position. If the ambient light brightness sensed by the ambient brightness recognition sensor 1024 is C2, C2 is smaller than C1, and the ambient light brightness becomes weaker, then the hinge component 1011 may control the curvature of the display module 10 of the flexibility in the edge area 10Y to be at the second gear position. The degree of bending may become smaller, and the brighter the environment, the greater the curvature of the edge area 10Y and the greater the degree of bending, such that the edge region 10Y may block the ambient light as much as possible and improve the display contrast.

FIG. 44 is another exemplary effect diagram of the display device shown in FIG. 2 and FIG. 3 applied to a vehicle-mounted display system. FIG. 45 is another exemplary flowchart of the control method of the display device according to various disclosed embodiments of the present disclosure. As shown in FIGS. 44-45 and referring to FIGS. 1-4, in one embodiment, in the control method of the display device, the working mode of the display device 000 may include at least a security mode and an operation mode. In the security mode, the flexible display module 10 does not work; or, the first motor component 401 may control the turning of the universal structure 30 such that the light-exiting surface of the flexible display module 10 may face away from the user, i.e., the driver M shown in FIG. 44. As shown in FIG. 4, in the operation mode, the first motor component 401 may control the turning of the universal structure 30 such that the light-exiting surface 10A of the flexible display module 10 faces the user.

This embodiment explains that the control method of the display device may control the working mode of the display device 000 to at least include the security mode and the operation mode. The security mode may be understood as the non-operation mode or the driver's interference prevention mode. In the security mode, regardless of where the light-exiting surface 10A of the flexible display module 10 is facing, the flexible display module 10 may be closed and not working; or, even if the light-exiting surface 10A of the flexible display module 10 is performing display work, such as playing songs or for use other than the driver, the first motor component 401 may control the steering of the universal structure 30 such that the light-exiting surface of the flexible display module 10 faces away from the user, i.e., the driver M as shown in FIG. 44. Such a configuration may prevent the flexible display module 10 from affecting the driver M, and may help to ensure driving safety. In one embodiment, the driver M in the driver's seat may select the display device 000 to enter the security mode through a voice control or buttons control the light-exiting surface 10A of the flexible display module 10 to stay away from the driver's viewing angle or to control the information screen of the flexible display module 10 to not display any screen to improve driving safety. The operation mode may be understood as the mode in which the user needs to interact with the flexible display module 10. At this time, the steering of the universal structure 30 may be controlled by the first motor component 401 such that the light-exiting surface 10A of the flexible display module 10 may face the user. The light-exiting surface 10A of the flexible display module 10 may face the view angle of the user such as the driver M as much as possible, and it may be convenient for the user to operate the light-exiting surface 10A of the flexible display module 10 on the premise that the user does not need to turn his head to divert his driving attention.

FIG. 46 is another exemplary flowchart of the control method of the display device according to various disclosed embodiments of the present disclosure. As shown in FIG. 46 and referring to FIG. 1 and FIGS. 8-10, in the control method of the display device, the control mode of the display device 000 may include at least a security mode and an operation mode; and the operation mode may also include a privacy mode.

In the privacy mode, the second motor component 402 may control the hinge component 1011 to bend to adjust the curvature of the flexible display module 10 such that the light-exiting surface 10A of the flexible display module 10 may only face the user.

This embodiment explains the control method of the display device to control the operation mode of the display device 000 to include at least a security mode and an operation mode. The operation mode may be understood as the mode in which the user needs to interact with the flexible display module 10. At this time, the steering of the universal structure 30 may be controlled by the first motor component 401 such that the light-exiting surface 10A of the flexible display module 10 may face the user, and the light-exiting surface 10A of the flexible display module 10 may face the viewing angle of the user as much as possible, i.e., the driver M. Accordingly, it may be convenient for the user to operate the light-emitting surface 10A of the flexible display module 10 on the premise that the user does not need to turn the head to distract the driving attention. Further, the operation mode may also include a privacy mode. In the privacy mode, after the sensor devices 102 senses the position of the user, the hinge component 1011 may further bend to change the curvature after receiving the bending command, and the second motor component 402 may further control the bending of the hinge component 1011 and adjust the curvature of the flexible display module 10 such that the light-exiting surface 10A of the flexible display module 10 may only face the user. With the combined adjustment of the universal structure 30 and the hinge component 1011, the viewing angle of the screen may be as desired, and the safety of use and the display effect may be better improved. Further, the light-exiting surface 10A of the flexible display module 10 may be controlled to only face the user, the privacy may be improved.

It can be known from the above embodiments that the display device and its control method provided by the present disclosure may at least achieve the following beneficial effects.

The display device provided by the present disclosure may include a flexible display module and a bracket. The flexible display module may include a supporting backplate on the backlight side of the flexible display module. The supporting backplate may be used to provide support for the flexible display panel. The display screen may be viewed on the side of the light-exiting surface of the flexible display module. In the present disclosure, the sensor devices may be electrically connected to the universal structure through the first motor component. The feedback information sensed by the sensor device, such as the user's position feedback, and/or sound feedback, etc., may be transmitted to the first motor component. After the first motor component transmits the kinetic energy to the universal structure, the universal structure may change its direction, and then control the direction of the supporting backplate to change the direction of the flexible display module such that the light-exiting surface of the flexible display module may face the user as much as possible to achieve a better viewing angle for the user. Further, the present disclosure may set the sensor devices to be electrically connected to the hinge component through the second motor component, and the feedback information sensed by the sensor devices, such as the user's position feedback, and/or sound feedback, etc., may be transmitted to the second motor component. The second motor component may transmit the kinetic energy to the hinge component through calculation such that the hinge component may change the bending degree, such as changing from a flat shape to a curved shape, or from a curved surface with a smaller curvature to a curved surface with a larger curvature, and then control the bending degree of the supporting backplate to change the bending degree of the flexible display module. By setting the light-exiting surface of the flexible display module as a curved surface, the light-exiting surface of the flexible display module may face the user as much as possible to achieve a better viewing angle for the user. The display device of the present disclosure may be applied to the central control panel area in the vehicle-mounted display system. Even if the display device is far away from the driver's position, the light-emitting surface of the flexible display module may be directed toward the driver at a better angle through the first motor component, the universal structure, the hinge component directs and the second motor in time according to the driver's position. Accordingly, the driver may watch the display screen of the light-exiting surface of the flexible display module without turning his head during the human-vehicle interaction, and the screen operation may be performed when necessary. Thus, the driver's sight may be prevented from leaving the driving direction during vehicle driving, which may be conducive to further improving driving safety. Further, after the light-exiting surface of the flexible display module is turned to face the user under the control of the universal structure, the hinge component may control the light-exiting surface of the flexible display module to be curved in different degrees to block the surrounding ambient light within the viewing range of the user. Accordingly, the contrast ratio when the user watches the display device may be improved, which may in turn be beneficial to enable the user to achieve the best viewing effect as possible and improve user satisfaction.

Although some specific embodiments of the present disclosure have been described in detail through examples, those skilled in the art should understand that the above examples are for illustration only and not intended to limit the scope of the present disclosure. Those skilled in the art will appreciate that modifications can be made to the above embodiments without departing from the scope and spirit of the disclosure. The scope of the disclosure is defined by the appended claims.

What is claimed is:

1. A display device, comprising:
a flexible display module;
a bracket; and
a reel,
wherein:
the flexible display module includes a supporting backplate;
the supporting backplate is located on a backlight side of the flexible display module;
the flexible display module also includes a plurality of sensor devices;
the bracket is fixed to the supporting backplate through a universal structure;
one end of the universal structure is fixed to the supporting backplate;
another end of the universal structure is fixed to the bracket;
the plurality of sensor devices are electrically connected to the universal structure through a first motor component configured to transfer a kinetic energy to the universal structure to change a direction of the universal structure; and/or the supporting backplate includes a hinge component and the plurality of sensor devices are electrically connected to the hinge component through a second motor component;
along a first direction, the flexible display module includes a main display region and an edge region located on at least one side of the main display region;
the first direction intersects an extension direction of a central axis around which the hinge component is bent;
under a control of the hinge component, a curvature of the flexible display module in at least one of edge regions is greater than or equal to a curvature of the flexible display module in the main display region;
along the first direction, the display device includes an extensible portion and a non-extensible portion adjacently arranged;
the extensible portion is located at the edge region;
the non-extensible portion includes a winding end located at a side of the non-extensible portion away from the extensible portion;
the winding end is fixed on the reel;
at least a part of the non-extensible portion is wound on the reel;
the reel is electrically connected to a third motor component; and
the third motor component is electrically connected to at least one of the plurality of sensor devices.

2. The display device according to claim 1, further comprising:
a first working mode; and
a second working mode,
wherein:
under the first working mode, the universal structure controls a light-exiting surface of the flexible display module to turn toward a first region; and under the second working mode, the universal structure controls the light-exiting surface of the flexible display module to turn toward a second region; and/or under the first working mode, the hinge component controls the supporting backplate to present a first surface; under the second working mode, the hinge component controls the supporting backplate to present a second surface; and a curvature of the first surface is different from a curvature of the second surface.

3. The display device according to claim 1, wherein the hinge component comprises:

a plurality of hinges arranged in a first direction, wherein:

one or more of the plurality of hinges includes a plurality of chain links connected to each other in a second direction;

the second direction is the extension direction of the central axis around which the hinge component is bent; and the first direction intersects the second direction.

4. The display device according to claim 1, wherein:

the plurality of sensor devices include a voice recognition sensor;

the voice recognition sensor recognizes a target area where a user is located; and the universal structure controls a light-exiting surface of the flexible display module to turn toward the target area.

5. The display device according to claim 4, wherein:

the plurality of sensor devices also include a human face recognition sensor or a human eye recognition sensor;

in the target area, the human face recognition sensor or the human eye recognition sensor recognizes a first position where the user is located; and the universal structure controls the light-exiting surface of the flexible display module to turn toward the first position.

6. The display device according to claim 1, wherein:

the plurality of sensor devices include an ambient brightness recognition sensor;

when the ambient brightness recognition sensor recognizes that ambient brightness is lower than a first threshold, the hinge component controls the supporting backplate to be flat; and when the ambient brightness recognition sensor recognizes that the ambient brightness is higher than the first threshold, the hinge component controls the supporting backplate to be curved.

7. The display device according to claim 1, wherein:

the plurality of sensor devices are arranged on a side of the light-exiting surface of the flexible display module and in a non-display region of the flexible display module.

8. The display device according to claim 1, wherein:

the plurality of sensor devices include a first sensor device and a second sensor device;

the first sensor device includes any one or more of a voice recognition sensor and an ambient brightness recognition sensor;

the second sensor device includes any one or more of a human face recognition sensor and a human eye recognition sensor;

the first sensor device is arranged on a side of a backlight surface of the flexible display module or the edge region of the flexible display module; and the second sensor device is arranged on a side of the light-exiting surface of the flexible display module.

9. The display device according to claim 1, comprising:

a display region and a non-display region arranged around the display region, wherein the edge region is located in the non-display region.

10. The display device according to claim 1, further comprising:

a first state; and a second state, wherein:

under the first state, both the extensible portion and the non-extensible portion serve as a display area of the display device; and under the second state, the non-extensible portion serves as the display area of the display device, and the extensible portion serves as a non-display area of the display device.

11. The display device according to claim 10, wherein:

under the first state, the hinge component controls the extensible portion and the non-extension portion to form an angle α, and 150°≤α≥180°; and under the second state, the hinge component controls the extensible portion and the non-extensible to form an angle β, and 80°≤β≤100°.

12. The display device according to claim 10, wherein:

the third motor component includes a rotating motor;

the plurality of sensor devices include at least an ambient brightness recognition sensor; and the rotating motor is electrically connected to the ambient brightness recognition sensor.

13. The display device according to claim 12, wherein:

when an ambient light brightness sensed by the ambient brightness recognition sensor is A1, a width of the extensible portion is B1; and when the ambient light brightness sensed by the ambient brightness recognition sensor is A2, the width of the extensible portion is B2, wherein A2>A1 and B2>B1.

14. A display device, comprising:

a flexible display module; and a bracket, wherein:

the flexible display module includes a supporting backplate;

the supporting backplate is located on a backlight side of the flexible display module;

the flexible display module also includes a plurality of sensor devices;

the bracket is fixed to the supporting backplate through a universal structure;

one end of the universal structure is fixed to the supporting backplate;

another end of the universal structure is fixed to the bracket;

the plurality of sensor devices are electrically connected to the universal structure through a first motor component; and/or the supporting backplate includes a hinge component and the plurality of sensor devices are electrically connected to the hinge component through a second motor component;

along a first direction, the flexible display module includes a main display region and an edge region located on at least one side of the main display region;

the edge region includes a bending region and a light-shielding region located on a side of the bending region away from the main display region; and the light-shielding region is located on a side of the light-exiting surface of the main display region.

15. A method for controlling a display device, comprising:
providing the display device including:
a flexible display module; and
a bracket,
wherein:
the flexible display module includes a supporting backplate;
the supporting backplate is located on a backlight side of the flexible display module;
the flexible display module also includes a plurality of sensor devices;
the bracket is fixed to the supporting backplate through a universal structure;
one end of the universal structure is fixed to the supporting backplate;
another end of the universal structure is fixed to the bracket; and
the plurality of sensor devices are electrically connected to the universal structure through a first motor component configured to transfer a kinetic energy to the universal structure to change a direction of the universal structure; and/or, the supporting backplate includes a hinge component and the plurality of sensor devices are electrically connected to the hinge component through a second motor component;
sensing a location of a user using the plurality of sensor devices; and
controlling the universal structure to turn to drive a light-exiting surface of the flexible display module to face the user using the first motor component; and/or controlling the hinge component to bend using the second motor component to adjust a curvature of the flexible display module,
wherein:
the method controls a working mode of the display device to at least include a security mode and an operation mode;
under the security mode, the flexible display module does not work; or, the first motor component controls the universal structure to turn such that the light-exiting surface of the flexible display module faces away from the user; and
under the operation mode, the first motor component controls the universal structure to turn such that the light-exiting surface of the flexible display module faces the user.

16. The method according to claim 15, wherein sensing the location of the user using the plurality of sensor devices and controlling the universal structure to turn to drive the light-exiting surface of the flexible display module to face the user using the first motor component comprises:
controlling an original state of the light-exiting surface of the flexible display module to turn toward a first region using the universal structure; and
controlling the light-exiting surface of the flexible display module to turn toward a second region using the universal structure after the plurality of the sensor devices senses that the location of the user is in the second region.

17. The method according to claim 16, wherein:
the plurality of sensor devices include at least a human face recognition sensor and a voice recognition sensor;
the voice recognition sensor senses a target area where the user is located, the human face recognition sensor is activated in the target area;

the first position where the user's face is located is determined; and
the universal structure controls the light-exiting surface of the flexible display module to turn toward the first position.

18. The method according to claim 15, wherein the plurality of sensor devices sense the position of the user, the second motor component controls the hinge component to bend to adjust the curvature of the flexible display module comprises:
controlling an original state of the supporting backplate to present a first surface using the hinge component;
sensing the position of the user using the plurality of sensor devices; and
controlling the supporting backplate to present a second surface using the hinge component such that a curvature of the second surface is greater than a curvature of the first surface.

19. The method according to claim 18, wherein:
the plurality sensor devices include an ambient brightness recognition sensor;
when the ambient brightness recognition sensor recognizes that ambient brightness is lower than a first threshold, the hinge component controls the supporting backplate to present the first surface, and the first surface is planar; and
when the ambient brightness recognition sensor recognizes that the ambient brightness is higher than the first threshold, the hinge component controls the supporting backplate to present the second surface, and the second surface is curved.

20. The method according to claim 15, wherein:
the flexible display module includes a middle region and edge regions located on opposite sides of the middle region;
under a control of the hinge component, a curvature of the flexible display module in at least one of the edge regions includes at least a first gear position and a second gear position;
a curvature of the flexible display module in the edge region at the first gear position is greater than a curvature of the flexible display module in the edge region at the second gear position;
the plurality of sensor devices includes at least an ambient brightness recognition sensor;
when ambient light brightness sensed by the ambient brightness recognition sensor is C1, the hinge component controls the curvature of the flexible display module in the edge area to be at the first gear position;
when the ambient light brightness sensed by the ambient brightness recognition sensor is C2, the hinge component controls the curvature of the flexible display module in the edge region to be at the second gear position; and
C1>C2.

21. The method according to claim 15, wherein the operation mode comprises:
a privacy mode,
wherein:
under the privacy mode, the second motor component controls the hinge component to bend to adjust a curvature of the flexible display module such that the light-exiting surface of the flexible display module only faces the user.

* * * * *